United States Patent
Lim et al.

(10) Patent No.: US 8,810,676 B2
(45) Date of Patent: Aug. 19, 2014

(54) ANALOG TO DIGITAL CONVERTERS, IMAGE SENSOR SYSTEMS, AND METHODS OF OPERATING THE SAME

(75) Inventors: Seung-Hyun Lim, Yongin-si (KR); Kwi-Sung Yoo, Seoul (KR); Kyoung-Min Koh, Hwaseong-si (KR); Yu-Jin Park, Seoul (KR); Chi-Ho Hwang, Seoul (KR); Yong Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 145 days.

(21) Appl. No.: 13/270,968

(22) Filed: Oct. 11, 2011

(65) Prior Publication Data

US 2012/0113286 A1  May 10, 2012

(30) Foreign Application Priority Data

Nov. 9, 2010 (KR) ........................ 10-2010-0110860

(51) Int. Cl.
*H04N 5/228* (2006.01)

(52) U.S. Cl.
USPC ............... 348/222.1; 348/207.99; 341/156

(58) Field of Classification Search
USPC .......... 348/222.1, 207.99; 341/155, 156, 158, 341/169, 170, 108
See application file for complete search history.

(56) References Cited

U.S. PATENT DOCUMENTS

| | | | |
|---|---|---|---|
| 6,670,904 B1 * | 12/2003 | Yakovlev | 341/167 |
| 2006/0055577 A1 | 3/2006 | Boemler | |
| 2008/0169955 A1 | 7/2008 | Inada | |
| 2009/0273500 A1 * | 11/2009 | Krymski | 341/155 |
| 2010/0134083 A1 * | 6/2010 | Trescases | 323/283 |
| 2010/0259660 A1 * | 10/2010 | Kukita | 348/308 |

FOREIGN PATENT DOCUMENTS

| | | |
|---|---|---|
| JP | 2008-054256 | 3/2008 |
| JP | 2008-177681 | 7/2008 |
| JP | 2009-218964 | 9/2009 |

* cited by examiner

*Primary Examiner* — Tuan Ho
*Assistant Examiner* — Zhenzhen Wu
(74) *Attorney, Agent, or Firm* — Myers Bigel Sibley & Sajovec, P.A.

(57) ABSTRACT

An analog to digital converter (ADC) can include a multi-input comparison unit configured to compare a pixel voltage from an image sensor, a comparison voltage comprising a stepped voltage modified during a coarse mode of operation, and a ramp voltage comprising a ramped voltage modified to one another during a fine mode of operation, to provide a comparison result signal that indicates whether the comparison voltage combined with the ramp voltage is greater than or less than the pixel voltage. A selection control signal generation unit can receive the comparison result signal and a mode control signal, to indicate the coarse or fine mode, to provide a selection control signal allowing modification of the comparison voltage in the coarse mode and to hold the comparison voltage constant in the fine mode. A reference voltage selection unit can receive the selection control signal to control modification of the comparison voltage.

18 Claims, 22 Drawing Sheets

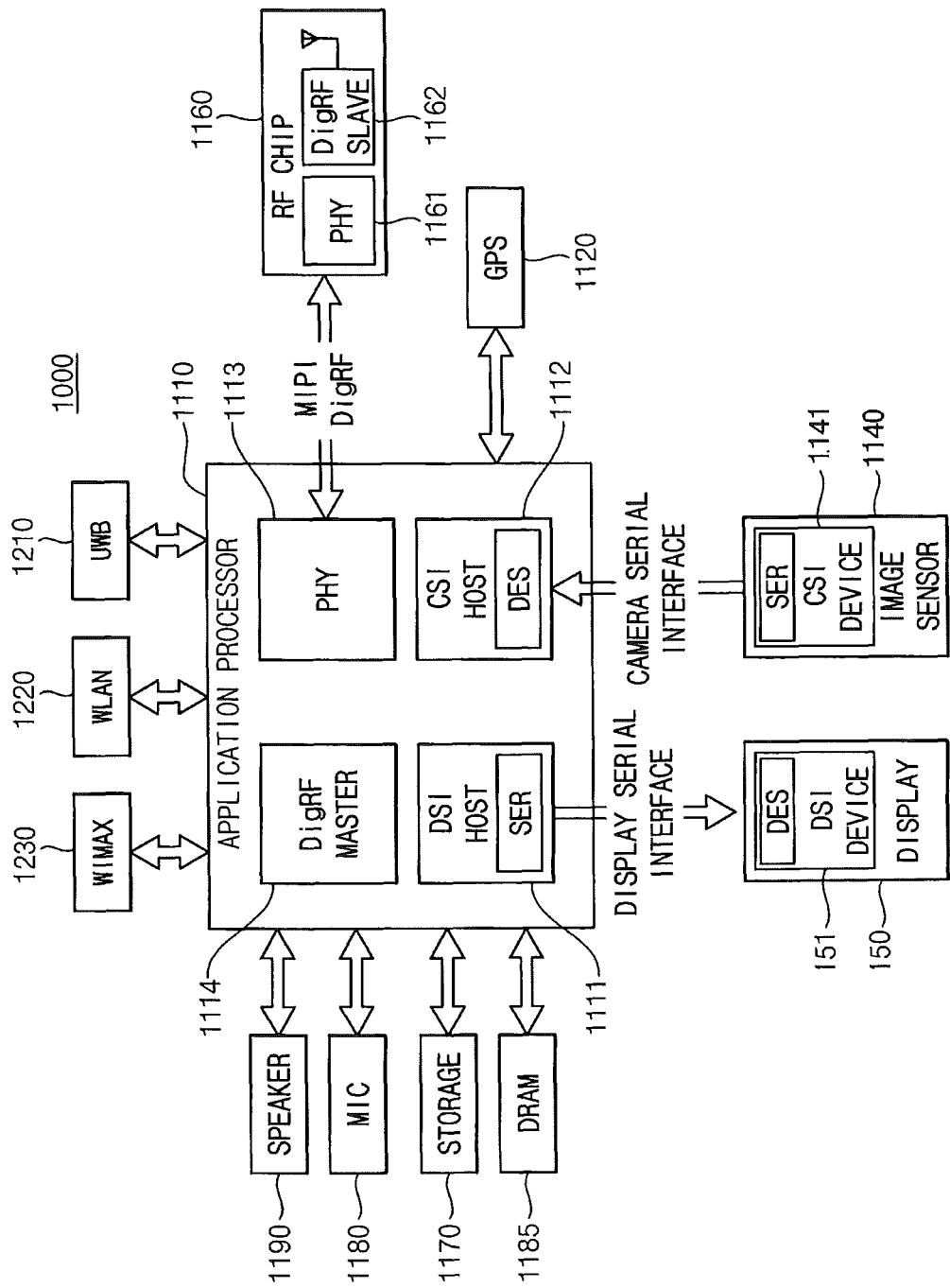

ANALOG TO DIGITAL CONVERTERS, IMAGE SENSOR SYSTEMS, AND METHODS OF OPERATING THE SAME

CROSS-REFERENCE TO RELATED APPLICATION

This application claims priority under 35 USC §119 to Korean Patent Application No. 10-2010-0110860, filed on Nov. 9, 2010, in the Korean Intellectual Property Office (KIPO), the contents of which are incorporated herein in its entirety by reference.

BACKGROUND

1. Technical Field

The present inventive concept relates to the field of electronics, and more particularly, to analog to digital converters.

2. Description of the Related Art

Typically, an image sensor may include an analog to digital converter that converts an analog signal (i.e., a pixel output voltage) output from a unit pixel into a digital signal. In detail, the analog to digital converter may convert the analog signal to the digital signal by comparing the pixel output voltage with a ramp voltage, and by counting a clock signal until the ramp voltage is the same as the pixel output voltage. However, since conventional analog to digital converters may use a plurality of ramp voltages, or include sampling capacitors, various problems such as excessive power consumption, offset mismatching, and ramp voltage slope mismatching may occur. Thus, an image sensor having the conventional analog to digital converters may not generate a high-quality image.

SUMMARY

Embodiments according to the inventive concept can provide analog to digital converters, image sensor systems, and methods of operating the same. Pursuant to these embodiments, an analog to digital converter (ADC) can include a multi-input comparison unit that is configured to compare a pixel voltage from an image sensor, a comparison voltage comprising a stepped voltage modified during a coarse mode of operation of the ADC, and a ramp voltage comprising a ramped voltage modified to one another during a fine mode of operation of the ADC, to provide a comparison result signal that indicates whether the comparison voltage combined with the ramp voltage is greater than or less than the pixel voltage. A selection control signal generation unit can receive the comparison result signal and a mode control signal, that indicates that the ADC is operating in coarse mode or fine mode, to provide a selection control signal to allow modification of the comparison voltage in the coarse mode and to hold the comparison voltage constant in the fine mode. A reference voltage selection unit can receive the selection control signal to control modification of the comparison voltage.

In some embodiments according to the inventive concept, the multi-input comparison unit can be further configured to compare the pixel voltage, the comparison voltage, the ramp voltage, and a ramp initial voltage comprising an initial comparison voltage provided to one another during the coarse mode. In some embodiments according to the inventive concept, the ADC can further include a digital signal generation unit that includes a counter circuit that can receive the comparison result signal that is configured to determine a number of bits representing the pixel value during the coarse mode and during the fine mode. A most significant bits (MSB) storage circuit that is configured to store a number of MSBs representing a first portion of the pixel value that is determined during the coarse mode. A least significant bits (LSB) storage circuit can be configured to store a number of LSBs that represent a second portion of the pixel value that is determined during the fine mode. A combiner circuit can be configured to combine the MSBs and the LSBs to provide a digital signal that represents the pixel value.

In some embodiments according to the inventive concept, the ADC can also include a correlated double sampling unit that is coupled to the multi-input comparison unit and can be configured to subtract a reset voltage conversion value from a data signal conversion value to determine a value subtracted from subsequent digital signals generated by the ADC. In some embodiments according to the inventive concept, the ADC can further include a digital signal generation unit that can include a counter circuit that receives the comparison result signal to determine a number of bits that represent the pixel value. A most significant bits (MSBs) storage circuit that is configured to store a number of MSBs that represent a first portion the pixel value that is determined during the coarse mode. A least significant bits (LSBs) storage circuit that is configured to store a number of LSBs that represent a second portion of the pixel value that is determined during the fine mode. A combiner that can be configured to combine the MSBs and the LSBs to provide a digital signal that represents the pixel value.

In some embodiments according to the inventive concept, the ADC can also include a digital signal generation unit that includes a counter circuit operating only in the fine mode by receiving the comparison result signal to determine a number of bits representing the pixel value. A most significant bits (MSBs) storage circuit that is configured to store a number of MSBs that represents a first portion of the pixel value. A least significant bits (LSBs) storage circuit that is configured to store a number of LSBs that represent a second portion of the pixel value that is determined by the counter circuit. A combiner that is configured to combine the MSBs and the LSBs to provide a digital signal that represent the pixel value and where the ADC can further include an MSB generation unit configured to receive the comparison result signal to generate the MSBs using successive approximation to approximate the comparison voltage responsive to the comparison result signal, where the MSBs are provided to the digital signal generation unit for storage in the most significant bits (MSB) storage circuit.

In some embodiments according to the inventive concept, the ADC can further include a digital signal generation unit that includes a counter circuit that can receive the comparison result signal to determine a number of bits representing the pixel value during the fine mode. A most significant bits (MSB) storage circuit can be configured to store a number of MSBs representing a first portion of the pixel value determined during the coarse mode. A least significant bits (LSBs) storage circuit can be configured to store a number of LSBs that represents a second portion of the pixel value that is determined during the fine mode. A combiner can be configured to combine the MSBs and the LSBs to provide a digital signal representing the pixel value.

In some embodiments according to the inventive concept, the selection control signal generation unit can be configured to store a value indicating the comparison voltage generated during the coarse mode used as a final comparison voltage, where the ADC can also include a digital signal generation unit that includes a counter circuit that can receive the comparison result signal to determine a number of bits representing the pixel value during the fine mode. A most significant bits (MSBs) storage circuit can be configured to store a number of MSBs that represents a first portion of the pixel value. A least significant bits (LSBs) storage circuit can be configured to store a number of LSBs that represents a second portion of the pixel value that is determined during the fine mode. A combiner can be configured to combine the MSBs and the LSBs to provide a digital signal that represents the pixel value and an MSB generation unit that can be configured to apply the value to a look-up table to map the value to the MSBs, where the MSBs are provided to the digital signal generation unit for storage in the most significant bits (MSB) storage circuit.

In some embodiments according to the inventive concept, the reference voltage selection unit can include a shift register circuit that can be configured to load an initial shift register value corresponding to an initial comparison voltage and configured to shift the initial shift register value left responsive to the selection control signal to provide a sequence of switch control signals corresponding to respective stepped comparison voltages. Comparison voltage switches each can be configured to operate responsive to the switch control signals to selectively provide a respective one of the stepped comparison voltages as the comparison voltage.

In some embodiments according to the inventive concept, a method of operating an ADC circuit can be provided by comparing a pixel voltage from an image sensor, a comparison voltage comprising a stepped voltage modified during a coarse mode of operation of the ADC, and a ramp voltage comprising a ramped voltage modified during a fine mode of operation of the ADC to one another, to provide a comparison result signal to indicate whether the comparison voltage combined with the ramp voltage is greater than or less than the pixel voltage. A selection control signal can be generated upon receiving the comparison result signal and a mode control signal, indicating that the ADC is operating in coarse mode or fine mode, to allow modification of the comparison voltage in the coarse mode and to hold the comparison voltage constant in the fine mode. The comparison voltage can be modified responsive to the selection control signal.

Other embodiments according to the inventive concept are also described herein.

BRIEF DESCRIPTION OF THE DRAWINGS

FIG. 29 is a block diagram illustrating an example of an interface used for an electric device of FIG. 28.

DETAILED DESCRIPTION OF THE EMBODIMENTS ACCORDING TO THE INVENTIVE CONCEPT

Figure 1:
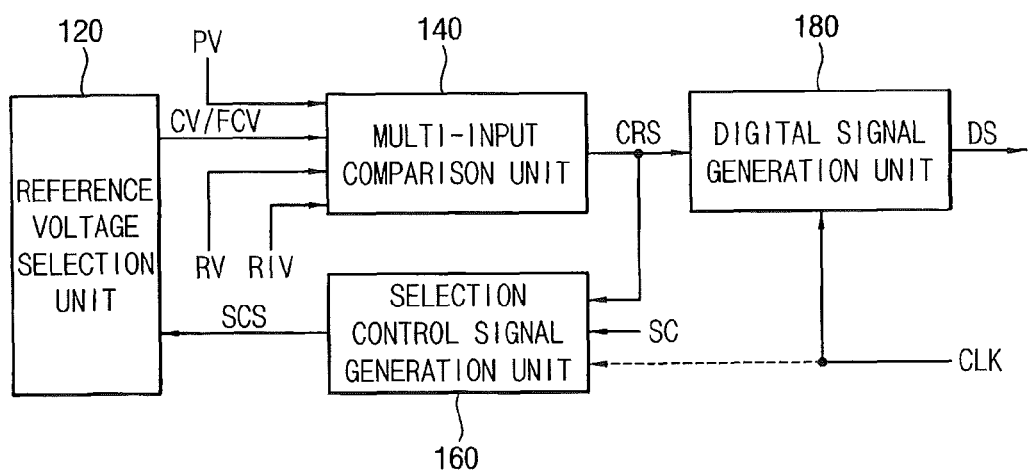
FIG. 1 is a block diagram illustrating an analog to digital converter according to some example embodiments.

Various example embodiments will be described more fully hereinafter with reference to the accompanying drawings, in which some example embodiments are shown. The present inventive concept may, however, be embodied in many different foul's and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an analog to digital converter according to some example embodiments.

Referring to FIG. 1, the analog to digital converter 100 may include a reference voltage selection unit 120, a multi-input comparison unit 140, a selection control signal generation unit 160, and a digital signal generation unit 180.

The reference voltage selection unit 120 may output a selected reference voltage CV (sometimes referred to herein as a comparison voltage) by selecting one of reference voltages based on a selection control signal SCS. In detail, the reference voltage selection unit 120 may change the selected reference voltage CV when the selection control signal SCS for updating the selected reference voltage CV is input, and the reference voltage selection unit 120 may not change the selected reference voltage CV when the selection control signal SCS for maintaining the selected reference voltage CV is input. The selection control signal SCS for updating the selected reference voltage CV may be input until a final reference voltage FCV is determined in a coarse comparison mode, and the selection control signal SCS for maintaining the selected reference voltage CV may be input after the final reference voltage FCV is determined in the coarse comparison mode until a fine comparison mode is finished. The reference voltage selection unit 120 may determine the final reference voltage FCV based on a first timing point at which a polarity of a comparison result signal CRS is changed from a first polarity to a second polarity in the coarse comparison mode. The reference voltage selection unit 120 may maintain the final reference voltage FCV after the final reference voltage FCV is determined in the coarse comparison mode until the fine comparison mode is finished. For example, the reference voltage selection unit 120 may determine the final reference voltage FCV as the selected reference voltage CV at the first timing point. In one example embodiment, the reference voltage selection unit 120 may include a reference voltage control block and a reference voltage output block. The reference voltage control block may generate an output control signal for selecting the selected reference voltage CV based on the selection control signal SCS. The reference voltage output block may output one of the reference voltages based on the output control signal. The reference voltage control block may be implemented by a shift register having a plurality of flip-flops in series. The reference voltage output block may be implemented by a plurality of switches for selecting one of the reference voltages. In this case, the selection control signal SCS for updating the selection reference voltage CV may correspond to a signal generated by passing a clock signal CLK, and the selection control signal SCS for maintaining the selection reference voltage CV may correspond to a signal generated by blocking the clock signal CLK. However, an implementation of the reference voltage selection unit 120 is not limited thereto.

In one example embodiment, the reference voltages may include a first through (n)th reference voltage. Here, n is an integer greater than 1. The reference voltages (i.e., the first through (n)th reference voltage) may be increased by a predetermined voltage as n increases. For example, the second reference voltage may be greater than the first reference voltage by the predetermined voltage, the third reference voltage may be greater than the second reference voltage by the predetermined voltage, and the (n)th reference voltage may be greater than the (n−1)th reference voltage. The reference voltage selection unit 120 may sequentially output the reference voltages (i.e., the first through (n)th reference voltage) as the selected reference voltage CV until the final reference voltage FCV is determined in the coarse comparison mode. In addition, the reference voltage selection unit 120 may output the final reference voltage FCV after the final reference voltage FCV is determined based on the first timing point in the coarse comparison mode until the fine comparison mode is finished. That is, the selected reference voltage CV may be increased in a step form, and may be determined as the final reference voltage FCV at the first timing point. A ramp voltage RV may be maintained as a ramp initial voltage RIV in the coarse comparison mode, and may be increased at a predetermined slope in the fine comparison mode. In one example embodiment, the ramp voltage RV may be increased with a predetermined slope by integer times of the predetermined voltage in the fine comparison mode. As described above, the final reference voltage FCV may be determined based on the first timing point at which the polarity of the comparison result signal CRS changes from a first polarity to a second polarity. For example, when the polarity of the comparison result signal CRS changes from a first polarity (e.g., a negative polarity) to a second polarity (e.g., a positive polarity) while the (m)th reference voltage is selected as the selected reference voltage CV, the (m)th reference voltage may be determined as the final reference voltage FCV at the first timing point.

In another example embodiment, the reference voltages may include a first through (n)th reference voltage. Here, n is an integer greater than 1. The reference voltages (i.e., the first through (n)th reference voltage) may be decreased by a predetermined voltage as n increases. For example, the second reference voltage may be less than the first reference voltage by the predetermined voltage, the third reference voltage may be less than the second reference voltage by the predetermined voltage, and the (n)th reference voltage may be less than the (n−1)th reference voltage. The reference voltage selection unit 120 may sequentially output the reference voltages (i.e., the first through (n)th reference voltage) as the selected reference voltage CV until the final reference voltage FCV is determined in the coarse comparison mode. The reference voltage selection unit 120 may output the final reference voltage FCV after the final reference voltage FCV is determined based on the first timing point in the coarse comparison mode until the fine comparison mode is finished. That is, the selected reference voltage CV may be decreased in a step form, and may be determined as the final reference voltage FCV at the first timing point. The ramp voltage RV may be maintained as the ramp initial voltage RIV in the coarse comparison mode, and may be decreased with a predetermined slope in the fine comparison mode. In one example embodiment, the ramp voltage RV may be decreased with a predetermined slope by integer times of the predetermined voltage in the fine comparison mode. As described above, the final reference voltage FCV may be determined based on the first timing point at which the polarity of the comparison result signal CRS changes from a first polarity to a second polarity. For example, when the polarity of the comparison result signal CRS changes from a first polarity (e.g., a positive polarity) to a second polarity (e.g., a negative polarity) while the (m)th reference voltage is selected as the selected reference voltage CV, the (m)th reference voltage may be determined as the final reference voltage FCV at the first timing point.

The multi-input comparison unit 140 may generate the comparison result signal CRS based on the selected reference voltage CV, the pixel output voltage PV, the ramp initial voltage RIV, and the ramp voltage RV. The multi-input comparison unit 140 may include input terminals for receiving the selected reference voltage CV, the pixel output voltage PV, the ramp initial voltage RIV, and the ramp voltage RV. As described above, the selected reference voltage CV may be increased or decreased in a step form, and may be selected as the final reference voltage FCV from the first timing point at which the polarity of the comparison result signal CRS is changed from a first polarity to a second polarity. The ramp voltage RV may be maintained as the ramp initial voltage RIV in the coarse comparison mode, and may be increased or decreased with a predetermined slope by integer times of the predetermined voltage in the fine comparison mode. In one example embodiment, the multi-input comparison unit 140 may include a first calculation block, a second calculation block, and an amplification block. The first calculation block may generate a first voltage difference between the selected reference voltage CV and the pixel output voltage PV. The second calculation block may generate a second voltage difference between the ramp voltage RV and the ramp initial voltage RIV. The amplification block may generate the comparison result signal CRS by amplifying a difference between the first voltage difference and the second voltage difference. For example, the multi-input comparison unit 140 may generate the comparison result signal CRS using [Expression 1] below.

$$CRS = A(CV - PV + RIV - RV) \quad \text{[Expression 1]}$$

(Here, CRS denotes the comparison result signal, A denotes a voltage gain of the amplification block, CV denotes the selected reference voltage, PV denotes the pixel output voltage, RIV denotes the ramp initial voltage, and RV denotes the ramp voltage.)

The analog to digital converter 100 may convert the analog signal (i.e., the pixel output voltage PV) to the digital signal by operating a dual mode of the coarse comparison mode and the fine comparison mode based on one ramp voltage RV. Here, the coarse comparison mode may correspond to a period in which a comparison mode signal SC has a first logic level, and the fine comparison mode may correspond to a period in which the comparison mode signal SC has a second logic level. When the multi-input comparison unit 140 generates the comparison result signal CRS in the coarse comparison mode, the second voltage difference between the ramp voltage RV and the ramp initial voltage RIV may be zero because the ramp voltage RV is maintained as the ramp initial voltage RIV. Thus, the comparison result signal CRS in the coarse comparison mode may substantially depend on the first voltage difference between the selected reference voltage CV and the pixel output voltage PV.

When the multi-input comparison unit 140 generates the comparison result signal CRS in the fine comparison mode, the first voltage difference between the selected reference voltage CV and the pixel output voltage PV may have a constant value generated by subtracting the pixel output voltage PV from the final reference voltage FCV. That is, in the fine comparison mode, the pixel output voltage PV may be fixed, and the selected reference voltage CV may be maintained as the final reference voltage FCV. Thus, the comparison result signal CRS in the fine comparison mode may substantially depend on the second voltage difference between the ramp voltage RV and the ramp initial voltage RIV.

The selection control signal generation unit 160 may generate the selection control signal SCS based on the comparison result signal CRS and the comparison mode signal SC. As described above, the coarse comparison mode may correspond to a period in which the comparison mode signal SC has a first logic level, and the fine comparison mode may correspond to a period in which the comparison mode signal SC has a second logic level. In detail, the selection control signal generation unit 160 may output the selection control signal SCS for updating the selected reference voltage CV until the final reference voltage FCV is determined based on the first timing point at which the polarity of the comparison result signal CRS is changed from a first polarity to a second polarity. The selection control signal generation unit 160 may output the selection control signal SCS for maintaining the final reference voltage FCV after the final reference voltage FCV (i.e., the selected reference voltage CV at the first timing point) is determined based on the first timing point until the fine comparison mode is finished. In one example embodiment, the selection control signal generation unit 160 may be implemented by a logic element (e.g., an AND gate). The logic element may generate the selection control signal SCS by performing a logic operation for the comparison result signal CRS, the clock signal CLK, and the comparison mode signal SC. For example, when the reference voltages (i.e., the first through (n)th reference voltage) may be decreased by the predetermined voltage as n increases, the selection control signal generation unit 160 may generate the selection control signal SCS for updating the selected reference voltage CV (e.g., passing the clock signal CLK) until the polarity of the comparison result signal CRS is changed from a first polarity (e.g., a positive polarity) to a second polarity (e.g., a negative polarity) at the first timing point in the coarse comparison mode, and may generate the selection control signal SCS for maintaining the final reference voltage FCV (e.g., blocking the clock signal CLK) after the final reference voltage FCV is determined based on the first timing point until the fine comparison mode is finished.

The digital signal generation unit 180 may generate a digital signal DS corresponding to the pixel output voltage PV by counting the clock signal CLK based on the comparison result signal CRS (i.e., a clock signal count method). For example, the digital signal generation unit 180 may be a counter-latch unit having at least one counter block and at least one storage block. Here, the storage block may be implemented by a plurality of storage devices such as latches, flip-flops, etc. However, an implementation of the storage devices is not limited thereto.

The analog to digital converter 100 may operate in dual modes: the coarse comparison mode and the fine comparison mode. Thus, the digital signal generation unit 180 may calculate most significant bits (MSBs) by counting the clock signal CLK until the polarity of the comparison result signal CRS is changed from a first polarity to a second polarity (i.e., the first timing point) in the coarse comparison mode, may calculate least significant bits (LSBs) by counting the clock signal CLK after the polarity of the comparison result signal CRS changes from a second polarity to a first polarity (i.e., a second timing point) in the fine comparison mode, and may generate the digital signal DS by summing the MSBs and the LSBs. Then, the digital signal DS may be displayed as an image by a digital signal processing (DSP) circuit. In one example embodiment, the digital signal generation unit 180 may include a counter block, a first storage block, a second storage block, and a summation block. The counter block may calculate the MSBs and the LSBs by counting the clock signal CLK based on the comparison result signal CRS. The first storage block may store the MSBs in the coarse comparison mode. The second storage block may store the LSBs in the fine comparison mode.

The summation block may output the digital signal DS by summing the MSBs and the LSBs. For example, the counter block may count the clock signal CLK to generate the MSBs from a start timing point of the coarse comparison mode to the first timing point in the coarse comparison mode. In addition, the counter block may count the clock signal CLK to generate the LSBs from the second timing point in the fine comparison mode to an end timing point of the fine comparison mode. The MSBs and the LSBs may be stored in the first storage block and the second storage block, respectively. The summation block may output the digital signal DS by summing the MSBs and the LSBs.

The analog to digital converter 100 may prevent offset mismatching and ramp voltage slope mismatching because the analog to digital converter 100 uses one ramp voltage RV, and may prevent (or reduce) time noise and unnecessary power consumption because the analog to digital converter 100 includes a multi-input comparator 140 without sampling capacitors. Since a feedback operation is performed among the reference voltage selection unit 120, the multi-input comparator 140, the selection control signal generation unit 160, and the digital signal generation unit 180 (i.e., a loop is formed), the analog to digital converter 100 may operate dual modes: the coarse comparison mode and the fine comparison mode, using one ramp voltage RV. As a result, an image sensor having the analog to digital converters 100 may generate a high-quality image. Further, the analog to digital converter 100 may have a simple structure as illustrated in FIG. 1. Thus, the analog to digital converter 100 may reduce power consumption and signal conversion time although a frame rate, a bit resolution, and the number of unit pixels in the image sensor may be increased. In the image sensor having the analog to digital converters 100, the number of the analog to digital converters 100 may be the same as the number of column lines coupled to an active pixel array. In addition, the column lines may be coupled to the analog to digital converters 100, respectively.

Figure 2:
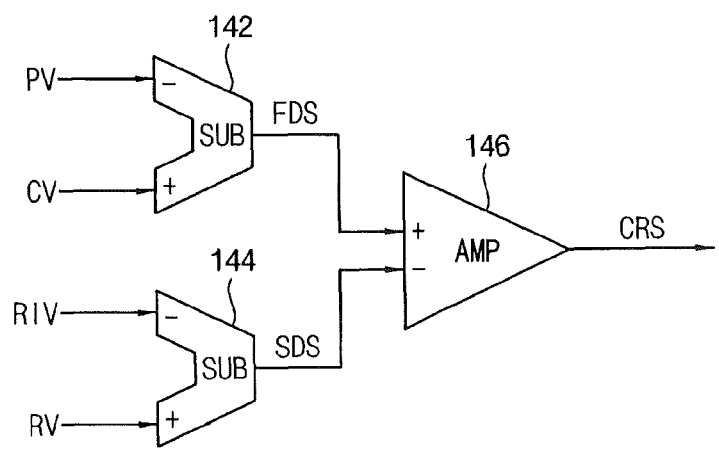
FIG. 2 is a block diagram illustrating an example of a multi-input comparison unit in an analog to digital converter of FIG. 1.

FIG. 2 is a block diagram illustrating an example of a multi-input comparison unit in an analog to digital converter of FIG. 1.

Referring to FIG. 2, the multi-input comparison unit 140 may include a first calculation block 142, a second calculation block 144, and an amplification block 146. As described above, the multi-input comparison unit 140 may generate the comparison result signal CRS based on the selected reference voltage CV, the pixel output voltage PV, the ramp initial voltage RIV, and the ramp voltage RV in the coarse comparison mode, and may generate the comparison result signal CRS based on the final reference voltage FCV, the pixel output voltage PV, the ramp initial voltage RIV, and the ramp voltage RV in the fine comparison mode.

The first calculation block 142 may receive the selected reference voltage CV and the pixel output voltage PV, and may generate the first voltage difference FDS between the selected reference voltage CV and the pixel output voltage CV. In one example embodiment, the first calculation block 142 may be implemented by a logic element such as a subtraction element. However, an implementation of the first calculation block 142 is not limited thereto. The second calculation block 144 may receive the ramp voltage RV and the ramp initial voltage RIV, and may generate the second voltage difference SDS between the ramp voltage RV and the ramp initial voltage RIV. In one example embodiment, the second calculation block 144 may be implemented by a logic element such as a subtraction element. However, an implementation of the second calculation block 144 is not limited thereto. As described above, the ramp voltage RV may be maintained as the ramp initial voltage RIV in the coarse comparison mode. Thus, the second voltage difference SDS may correspond to zero. A magnitude of the second voltage difference SDS may be increased in the fine comparison mode. The amplification block 146 may receive the first voltage difference FDS output from the first calculation block 142 and the second voltage difference SDS output from the second calculation block 144, and may generate the comparison result signal CRS by amplifying the difference between the first voltage difference FDS and the second voltage difference SDS. The analog to digital converter 100 may operate dual modes: the coarse comparison mode and the fine comparison mode, using one ramp voltage RV. In detail, the multi-input comparison unit 140 may output the comparison result signal CRS based on the selected reference voltage CV, the pixel output voltage PV, the ramp voltage RV, and the ramp initial voltage RIV in the coarse comparison mode, and may output the comparison result signal CRS based on the final reference voltage FCV, the pixel output voltage PV, the ramp voltage RV, and the ramp initial voltage RIV in the fine comparison mode.

In the coarse comparison mode, the second voltage difference SDS may be zero because the ramp voltage RV is the same as the ramp initial voltage RIV. Thus, in the coarse comparison mode, the multi-input comparison unit 140 may generate the comparison, result signal CRS by amplifying the first voltage difference FDS, and may determine the final reference voltage FCV based on the comparison result signal CRS at the first timing point. In the fine comparison mode, the multi-input comparison unit 140 may generate the comparison result signal CRS by amplifying the difference between the first voltage difference FDS and the second voltage difference SDS, and may detect a voltage level of the pixel output voltage PV based on the comparison result signal CRS. As described above, when the reference voltages (i.e., the first through (n)th reference voltages CV1 through CVn) are increased by the predetermined voltage as n increases, the ramp voltage RV may be maintained as the ramp initial voltage RIV in the coarse comparison mode, and may be increased at a predetermined slope by integer times the predetermined voltage in the fine comparison mode. In addition, when the reference voltages (i.e., the first through (n)th reference voltages CV1 through CVn) are decreased by the predetermined voltage as n increases, the ramp voltage RV may be maintained as the ramp initial voltage RIV in the coarse comparison mode, and may be decreased at a predetermined slope by integer times the predetermined voltage in the fine comparison mode. The analog to digital converter 100 may operate in a dual mode including the coarse comparison mode and the fine comparison mode based on one ramp voltage RV. As a result, the analog to digital converter 100 may prevent (or reduce) offset mismatching and ramp voltage slope mismatching, and may prevent (or reduce) time noise and unnecessary power consumption due to sampling capacitors.

Figure 3:
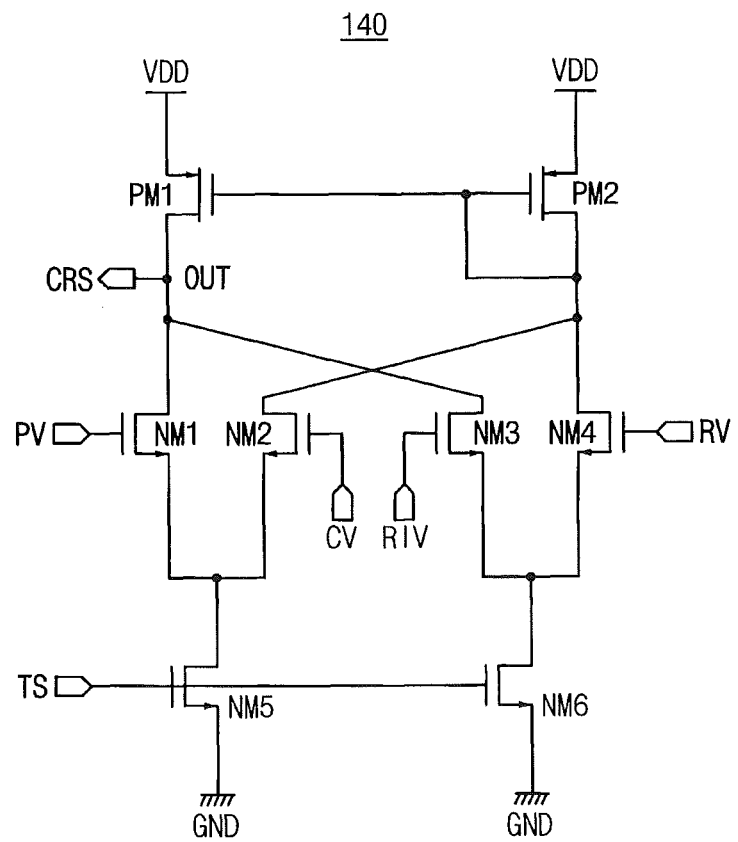
FIG. 3 is a circuit diagram illustrating an example of a multi-input comparison unit of FIG. 2.

FIG. 3 is a circuit diagram illustrating an example of a multi-input comparison unit of FIG. 2.

Referring to FIG. 3, the multi-input comparison unit 140 may include a first P-type metal oxide semiconductor (PMOS) transistor PM1, a second PMOS transistor PM2, a first N-type metal oxide semiconductor (NMOS) transistor NM1, a second NMOS transistor NM2, a third NMOS transistor NM3, a fourth NMOS transistor NM4, a fifth NMOS transistor NM5, and a sixth NMOS transistor NM6.

A source terminal of the first PMOS transistor PM1 may be coupled to a power voltage VDD, a gate terminal of the first PMOS transistor PM1 may be coupled to a gate of the second PMOS transistor PM2, and a drain terminal of the first PMOS transistor PM1 may be coupled to an output node OUT. A source terminal of the second PMOS transistor PM2 may be coupled to the power voltage VDD, a gate terminal of the second PMOS transistor PM2 may be coupled to the gate of the first PMOS transistor PM1 and a drain terminal of the second PMOS transistor PM2, and a drain terminal of the second PMOS transistor PM2 may be coupled to a drain terminal of the second NMOS transistor NM2.

A drain terminal of the first NMOS transistor NM1 may be coupled to the output terminal OUT, the pixel output voltage PV may be input to the drain terminal of the first NMOS transistor NM1, and a source terminal of the first NMOS transistor NM1 may be coupled to a drain terminal of the fifth NMOS transistor NM5. A drain terminal of the second NMOS transistor NM2 may be coupled to the drain terminal of the second PMOS transistor PM2, the selected reference voltage CV may be input to a gate terminal of the second NMOS transistor NM2, and a source terminal of the second NMOS transistor NM2 may be coupled to a drain terminal of the fifth NMOS transistor NM5. A drain terminal of the third NMOS transistor NM3 may be coupled to the output terminal OUT, the ramp initial voltage RIV may be input to the drain terminal of the third NMOS transistor NM3, and a source terminal of the third NMOS transistor NM3 may be coupled to a drain terminal of the sixth NMOS transistor NM6. A drain terminal of the fourth NMOS transistor NM4 may be coupled to the drain terminal of the second PMOS transistor PM2, the ramp voltage RV may be input to a gate terminal of the fourth NMOS transistor NM4, and a source terminal of the fourth NMOS transistor NM4 may be coupled to the drain terminal of the sixth NMOS transistor NM6.

A drain terminal of the fifth NMOS transistor NM5 may be coupled to the source terminals of the first NMOS transistor NM1 and the second NMOS transistor NM2, a timing signal TS may be input to a gate terminal of the fifth NMOS transistor NM5, and a source terminal of the fifth NMOS transistor NM5 may be coupled to a ground voltage GND. A drain terminal of the sixth NMOS transistor NM6 may be coupled to the source terminals of the third NMOS transistor NM3 and the fourth NMOS transistor NM4, the timing signal TS may be input to a gate terminal of the sixth NMOS transistor NM6, and a source terminal of the sixth NMOS transistor NM6 may be coupled to the ground voltage GND.

The first and second PMOS transistor PM1 and PM2, the first and second NMOS transistors NM1 and NM2, and the fifth NMOS transistor NM5 constitute a first differential amplifier, that the first and second PMOS transistors PM1 and PM2, the third and fourth NMOS transistors NM3 and NM4, and the sixth NMOS transistor NM6 constitute a second differential amplifier, and that the first differential amplifier and the second differential amplifier are cross-coupled with each other.

As illustrated in FIG. 3, the first differential amplifier may receive the pixel output voltage PV at the gate terminal of the first NMOS transistor NM1, may receive the selected reference voltage CV at the gate terminal of the second NMOS transistor NM2, and may generate a first amplified voltage difference (i.e., A(CV−PV)) by amplifying the first voltage difference between the selected reference voltage CV and the pixel output voltage PV. Similarly, the second differential amplifier may receive the ramp initial voltage RIV at the gate terminal of the third NMOS transistor NM3, may receive the ramp voltage RV at the gate terminal of the fourth NMOS transistor NM4, and may generate a second amplified voltage difference (i.e., A(RV−RIV)) by amplifying the second voltage difference between the ramp voltage RV and the ramp initial voltage RIV.

The voltage difference (i.e., A(CV−PV+RIV−RV)) between the first amplified voltage difference (i.e., A(CV−PV)) and the second amplified voltage difference (i.e., A(RV−RIV)) may be output as the comparison result signal CRS at the output terminal OUT by a current mirror that is implemented by the first and second PMOS transistor PM1 and PM2, and the fifth and sixth NMOS transistor NM5 and NM6. As described above, the multi-input comparison unit 140 may receive the selected reference voltage CV, the pixel output voltage PV, the ramp voltage RV, and the ramp initial voltage RIV, and may output the comparison result signal CRS based on the selected reference voltage CV, the pixel output voltage PV, the ramp voltage RV, and the ramp initial voltage RIV. However, a structure of the multi-input comparison unit 140 is not limited thereto.

Figure 4:
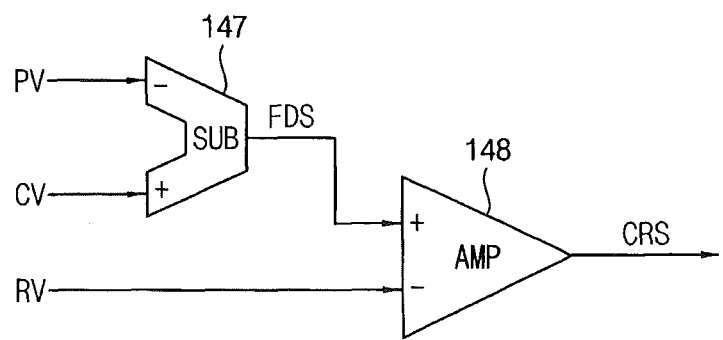
FIG. 4 is a block diagram illustrating another example of a multi-input comparison unit in an analog to digital converter of FIG. 1.

FIG. 4 is a block diagram illustrating another example of a multi-input comparison unit in an analog to digital converter of FIG. 1.

Referring to FIG. 4, the multi-input comparison unit 140 may include three input terminals. In this case, the multi-input comparison unit 140 may include a calculation block 147 and an amplification block 148. As illustrated in FIG. 4, the multi-input comparison 140 may not receive the ramp initial voltage RIV.

The calculation block 147 may receive the selected reference voltage CV and the pixel output voltage PV, and may generate the first voltage difference FDS between the selected reference voltage CV and the pixel output voltage CV. In one example embodiment, the calculation block 147 may be implemented by a logic element such as a subtraction element. However, an implementation of the calculation block 147 is not limited thereto. The amplification block 148 may receive the ramp voltage RV and the first voltage difference FDS output from the first calculation block 142, and may generate the comparison result signal CRS by amplifying the difference between the first voltage difference FDS and the ramp voltage RV.

Figure 5:
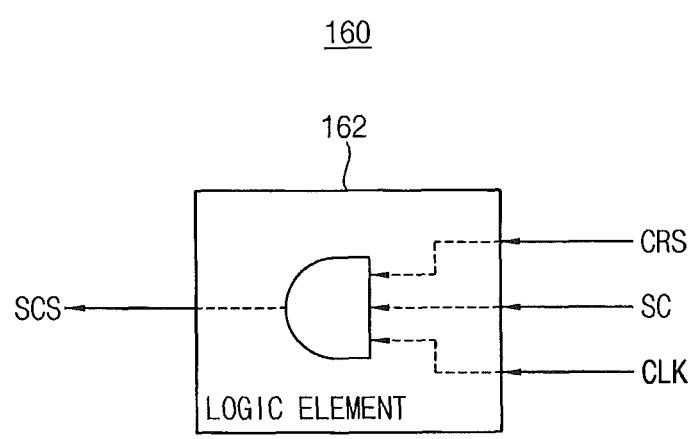
FIG. 5 is a block diagram illustrating an example of a selection control signal generation unit in an analog to digital converter of FIG. 1.

FIG. 5 is a block diagram illustrating an example of a selection control signal generation unit in an analog to digital converter of FIG. 1.

Referring to FIG. 5, the selection control signal generation unit 160 may include a logic element 162. The logic element 162 may perform a logic operation on the comparison result signal CRS, the clock signal CLK, and the comparison mode signal SC to generate the selection control signal SCS. According to some example embodiments, the selection control signal generation unit 160 may generate the selection control signal SCS using only the comparison result signal CRS and the comparison mode signal SC. In this case, the clock signal CLK may not be input to the selection control signal generation unit 160.

The selection control signal generation unit 160 may output the selection control signal SCS for updating the selected reference voltage CV until the polarity of the comparison result signal CRS changes in the coarse comparison mode (i.e., the first timing point), and may output the selection control signal SCS for maintaining the selected reference voltage CV (i.e., the final reference voltage) after the polarity of the comparison result signal CRS changes in the coarse comparison mode (i.e., the first timing point) until the fine comparison mode is finished. In one example embodiment, the selection control signal generation unit 160 may be an AND gate. The AND gate may perform an AND logic operation on the comparison result signal CRS, the clock signal CLK, and the comparison mode signal SC. For example, when the reference voltages (i.e., the first through (n)th reference voltages CV1 through CVn) are decreased by the predetermined voltage as n increases, the selection control signal generation unit 160 may output the clock signal CLK as the selection control signal SCS from the start timing point of the coarse comparison mode to the first timing point. Here, the comparison mode signal SC in the coarse comparison mode may have a logic "HIGH" level. The selection control signal generation unit 160 may output the selection control signal SCS having a logic "LOW" level from the first timing point to an end timing point of the coarse comparison mode. In the fine comparison mode, the comparison mode signal SC has a logic "LOW" level. As a result, the selection control signal generation unit 160 may output the selection control signal SCS having the logic "LOW" level in the fine comparison mode.

As described above, when the selection control signal generation unit 160 outputs the selection control signal SCS for updating the selected reference voltage CV, the reference voltage selection unit 120 may select one of the reference voltages (i.e., the first through (n)th reference voltage CV1 through CVn) as the selected reference voltage CV. When the selection control signal generation unit 160 outputs the selection control signal SCS for maintaining the selected reference voltage CV, the reference voltage selection unit 120 may maintain the selected reference voltage CV as the final reference voltage FCV.

Figure 6:
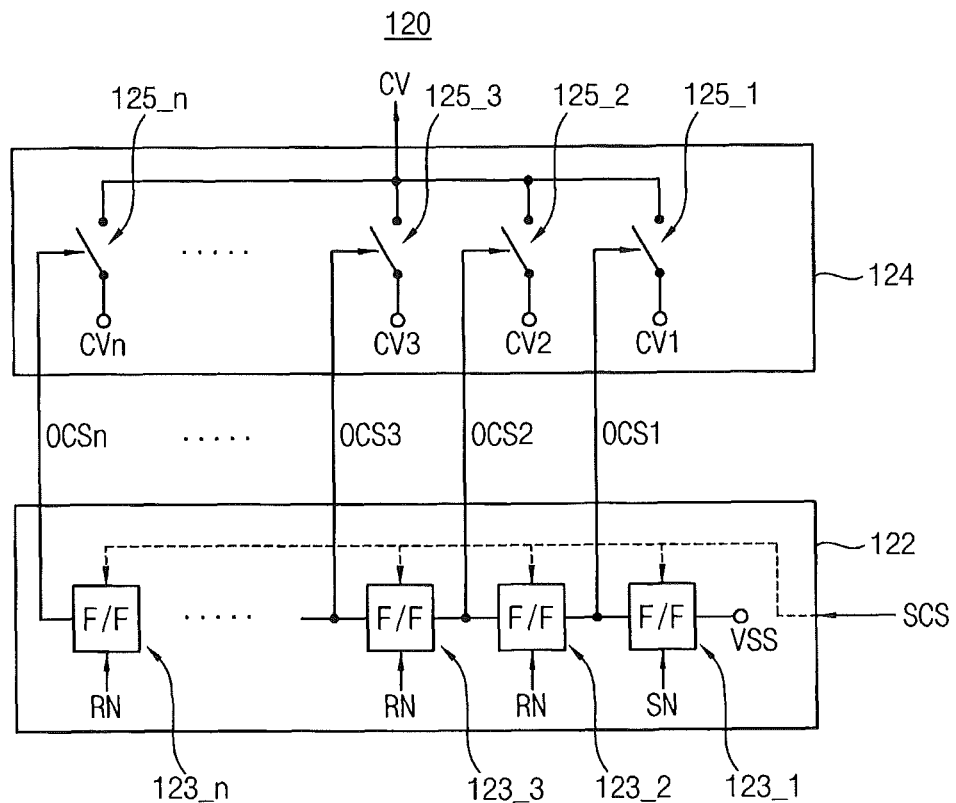
FIG. 6 is a block diagram illustrating an example of a reference voltage selection unit in an analog to digital converter of FIG. 1.

FIG. 6 is a block diagram illustrating an example of a reference voltage selection unit in an analog to digital converter of FIG. 1.

Referring to FIG. 6, the reference voltage selection unit 120 may include a reference voltage control block 122 and a reference voltage output block 124. The reference voltage selection unit 120 may change the selected reference voltage CV until the final reference voltage FCV is determined in the coarse comparison mode, and may maintain the selected reference voltage CV as the final reference voltage FCV from the first timing point to the end timing point of the fine comparison mode.

The reference voltage control block 122 may generate a first through (n)th control signals OCS1 through OCSn for selecting the selected reference voltage CV based on the selection control signal SCS input from the selection control signal generation unit 160. In one example embodiment, the reference voltage control block 122 may be implemented by a shift register having a first through (n)th flip-flop 123_1 through 123_n in series. The reference voltage control block 122 may change the selected reference voltage CV by changing the first through (n)th output control signals OCS1 through OCSn when the selection control signal SCS for updating the selected reference voltage CV is input from the selection control signal generation unit 160. The reference voltage control block 122 may not change the selected reference voltage CV by maintaining the first through (n)th output control signals OCS1 through OCSn when the selection control signal SCS for maintaining the selected reference voltage CV is input from the selection control signal generation unit 160. For example, in the reference voltage control block 122, when the selection control signal SCS for updating the selected reference voltage CV is input (e.g., the clock signal CLK is passed), the first through (n)th flip-flop 123_1 through 123_n may output internal data based on a rising edge or a falling edge of the clock signal CLK. Here, an input terminal of the second flip-flop 123_2 may be coupled to an output terminal of the first flip-flop 123_1, an input terminal of the third flip-flop 123_3 may be coupled to an output terminal of the second flip-flop 123_2, and an input terminal of the n(th) flip-flop 123_n may be coupled to an output terminal of the (n−1)th flip-flop 123_n−1. That is, the first through (n)th flip-flop 123_1 through 123_n may be coupled in series. Initial data VSS having a logic "LOW" level may be input to an input terminal of the first flip-flop 123_1, the internal data having a logic "HIGH" level may be stored in the first flip-flop 123_1 based on a first initial control voltages SN, and the internal data having a logic "LOW" level may be stored in the second through (n)th flip-flop 123_2 through 123_n based on based on a second initial control voltages RN. Subsequently, the internal data having a logic "HIGH" level stored in the first flip-flop 123_1 may be sequentially transferred to the second through (n)th flip-flop 123_2 through 123_n at a rising edge or a falling edge of the clock signal CLK when the selection control signal SCS for updating the selected reference voltage CV is input (e.g., the clock signal CLK is passed). Assuming that n is 5, logic levels of the internal data stored in the first through fifth flip-flop 123_1 through 123_5 may be change sequentially, for example, 10000, 01000, 00100, 00010, and 00001.

The reference voltage output block 124 may be implemented by a first through (n)th switches 125_1 through 125_n for outputting one of the first through (n)th reference voltage CV1 through CVn as the selected reference voltage CV. In one example embodiment, the first through (n)th switches 125_1 through 125_n may output one of the first through (n)th reference voltage CV1 through CVn as the selected reference voltage CV based on the first through (n)th output control signal OCS1 through OCSn, respectively. For example, the first switch 125_1 may perform a switching operation to output the first reference voltage CV1 as the selected reference voltage CV based on the first output control signal OCS1, the second switch 125_2 may perform a switching operation to output the second reference voltage CV2 as the selected reference voltage CV based on the second output control signal OCS2, the third switch 125_3 may perform a switching operation to output the third reference voltage CV3 as the selected reference voltage CV based on the third output control signal OCS3, and the (n)th switch 125_n may perform a switching operation to output the (n)th reference voltage CVn as the selected reference voltage CV based on the (n)th output control signal OCSn. Thus, the first through (n)th switches 125_1 through 125_n may be sequentially turned on based on the first through (n)th output control signal OCS1 through OCSn when internal data having a logic "HIGH" level stored in the first flip-flop 123_1 is sequentially transferred to the second through (n)th flip-flop 1232 through 123_n at a rising edge or a falling edge of the clock signal CLK. Assuming that n is 5, logic levels of the first through fifth output control signal OCS1 through OCS5 may change sequentially, for example, 10000, 01000, 00100, 00010, and 00001. As a result, the first through fifth reference voltage CV1 through CV5 may be sequentially output as the selected reference voltage CV.

Figure 7:
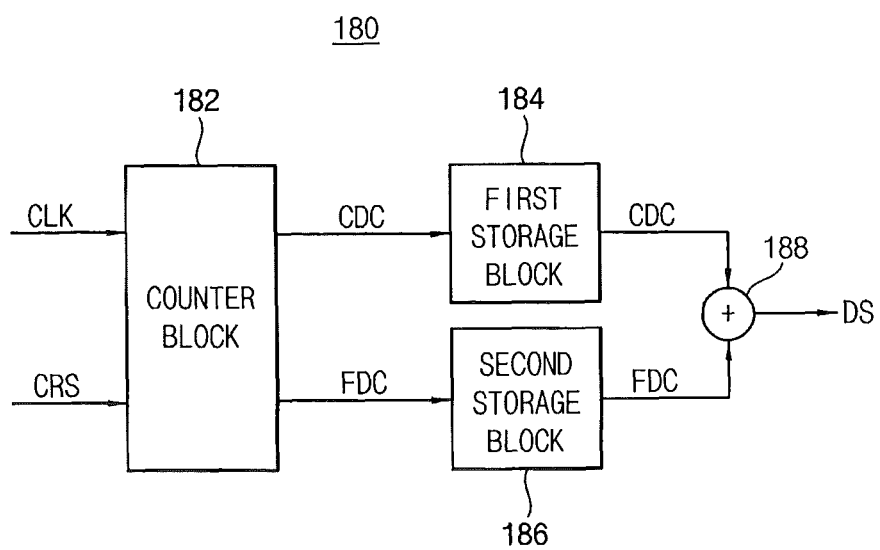
FIG. 7 is a block diagram illustrating an example of a digital signal generation unit in an analog to digital converter of FIG. 1.

FIG. 7 is a block diagram illustrating an example of a digital signal generation unit in an analog to digital converter of FIG. 1.

Referring to FIG. 7, the digital signal generation unit 180 may include a counter block 182, a first storage block 184, a second storage block 186, and a summation block 188. As described above, the digital signal generation unit 180 may generate the digital signal DS corresponding to the pixel output voltage PV by counting the clock signal CLK based on the comparison result signal CRS.

The counter block 182 may calculate most significant bits CDC and least significant bits FDC by counting the clock signal CLK based on the comparison result signal CRS. In detail, the counter block 182 may generate the most significant bits CDC by counting the clock signal CLK from the start timing point of the coarse comparison mode to the first timing point (i.e., at which the polarity of the comparison result signal CRS changes in the coarse comparison mode). In addition, the counter block 182 may generate the least significant bits FDC by counting the clock signal CLK from the second timing point (at which the polarity of the comparison result signal CRS changes) to the end timing point of the fine comparison mode. However, a calculation of the counter block 182 for the most significant bits CDC and the least significant bits FDC is not limited thereto. Since the analog to digital converter 100 operates a dual mode including the coarse comparison mode and the fine comparison mode, the counter block 182 may calculate the most significant bits CDC of the digital signal DS in the coarse comparison mode, and may calculate the least significant bits FDC of the digital signal DS in the fine comparison mode. For example, assuming that the analog signal (i.e., the pixel output voltage PV) is converted into the digital signal DS of 8 bits, most significant 4 bits CDC may be calculated in the coarse comparison mode, and least significant 4 bits FDC may be calculated in the fine comparison mode.

The first storage block 184 may store the most significant bits CDC in the coarse comparison mode. The second storage block 186 may store the least significant bits FDC in the fine comparison mode. The analog to digital converter 100 may enable the counter block 182 and the first storage block 184 in the coarse comparison mode, and may enable the counter block 182 and the second storage block 186 in the fine comparison mode. In detail, when the counter block 182 generates the most significant bits CDC by counting the clock signal CLK from the start timing point of the coarse comparison mode to the first timing point in the coarse comparison mode, the first storage block 184 may store the most significant bits CDC. When the counter block 182 generates the least significant bits FDC by counting the clock signal CLK from the second timing point in the fine comparison mode to the end timing point of the fine comparison mode, the second storage block 186 may store the least significant bits FDC. The first storage block 184 and the second storage block 186 may be implemented by a plurality of storage devices such as latches, flip-flops, etc. However, the storage devices are not limited thereto. The summation block 188 may generate the digital signal DS by summing the most significant bits CDC output from the first storage block 184 and the least significant bits FDC output from the second storage block 186. Then, the digital signal DS may be displayed as an image by a DSP circuit of an image sensor.

Figure 8:
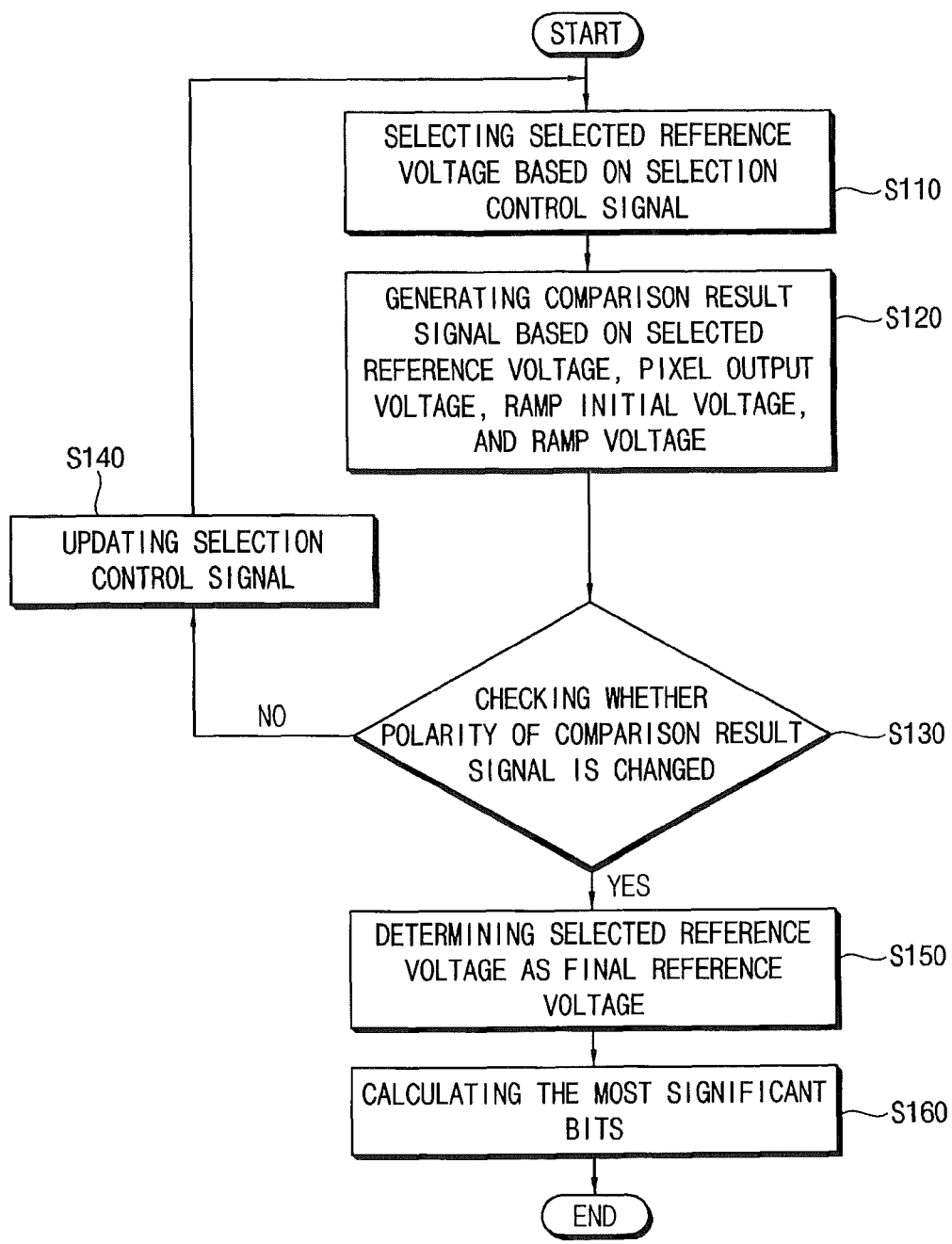
FIG. 8 is a flow chart illustrating an operation of an analog to digital converter of FIG. 1 in a coarse comparison mode.

FIG. 8 is a flow chart illustrating an operation of an analog to digital converter of FIG. 1 in a coarse comparison mode.

Referring to FIG. 8, the analog to digital converter 100 may select the selected reference voltage among the reference voltages based on the selection control signal (Step S110). Here, the analog to digital converter 100 may change the selected reference voltage when the selection control signal for updating the selected reference voltage is input, and may maintain the selected reference voltage (i.e., the final reference voltage) when the selection control signal for maintaining the selected reference voltage is input. Then, the analog to digital converter 100 may generate the comparison result signal based on the selected reference voltage, the pixel output voltage, the ramp initial voltage, and the ramp voltage (Step S120). In one example embodiment, the comparison result signal may be generated using the [Expression 1]. The comparison result signal may correspond to a value generated by subtracting the second voltage difference between the ramp voltage and the ramp initial voltage from the first voltage difference between the selected reference voltage and the pixel output voltage, and by multiplying the subtraction result by the voltage gain of the amplification block. As described above, the ramp voltage may correspond to the ramp initial voltage in the coarse comparison mode. Thus, the second voltage difference may be zero. That is, the comparison result signal in the coarse comparison mode may substantially depend on the first voltage difference between the selected reference voltage and the pixel output voltage. Then, the analog to digital converter 100 may check whether the polarity of the comparison result signal is changed from a first polarity to a second polarity (Step S130). If the polarity of the comparison result signal is not changed (S130) from a first polarity to a second polarity, Steps S110 and S120 may be performed again by changing the selected control signal (Step S140). If the polarity of the comparison result signal is changed (S130) from a first polarity to a second polarity, the selected reference voltage may be determined as the final reference voltage (Step S150). The final reference voltage may be maintained after the polarity of the comparison result signal is changed from a first polarity to a second polarity in the coarse comparison mode (i.e., the first timing point) until the coarse comparison mode is finished (i.e., the end timing point of the coarse comparison mode). For example, when the reference voltages (i.e., the first through (n)th reference voltage) are decreased by the predetermined voltage as n increases, the polarity of the comparison result signal may be changed from a positive polarity to a negative polarity at the first timing point. On the other hand, when the reference voltages (i.e., the first through (n)th reference voltage) are increased by the predetermined voltage as n increases, the polarity of the comparison result signal may be changed from a negative polarity to a positive polarity at the first timing point. The analog to digital converter 100 may calculate the most significant bits by counting the clock signal from the start timing point of the coarse comparison mode to the first timing point.

Figure 9:
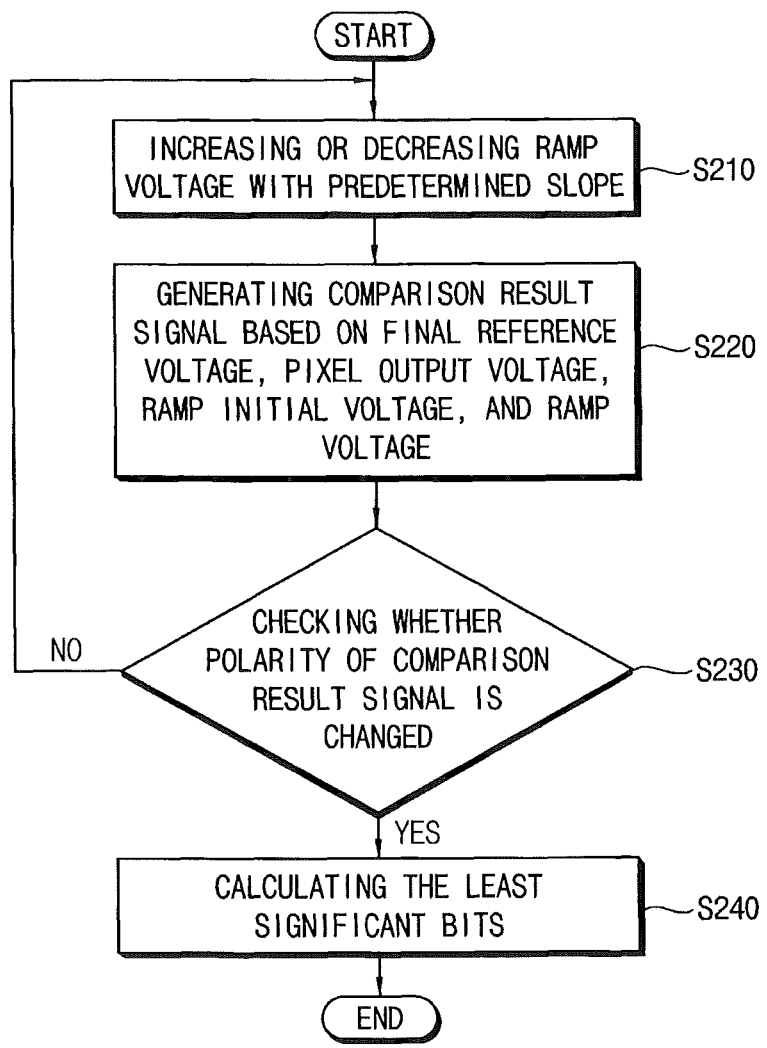
FIG. 9 is a flow chart illustrating an operation of an analog to digital converter of FIG. 1 in a fine comparison mode.

FIG. 9 is a flow chart illustrating an operation of an analog to digital converter of FIG. 1 in a fine comparison mode.

Referring to FIG. 9, the analog to digital converter 100 may generate the comparison result signal based on the final reference voltage, the pixel output voltage, the ramp initial voltage, and the ramp voltage (Step S220) when the ramp voltage is decreased or increased with a predetermined slope (Step S210). The comparison result signal may be generated using the [Expression 1]. The ramp voltage may be generated by a voltage generation circuit of an image sensor. As described above, the ramp voltage may correspond to the ramp initial voltage in the coarse comparison mode, and may be decreased or increased with a predetermined slope in the fine comparison mode. In one example embodiment, in the fine comparison mode, the ramp voltage may be decreased or increased by integer times the predetermined voltage that corresponds to a voltage difference among the reference voltages (i.e., the first through (n)th reference voltage). The comparison result signal may be a value generated by subtracting the second voltage difference between the ramp voltage and the ramp initial voltage from the first voltage difference between the final reference voltage and the pixel output voltage, and by multiplying the subtraction result by the voltage gain of the amplification block.

As described above, the first voltage difference between the final reference voltage and the pixel output voltage may have a constant value because the pixel output voltage is fixed, and the selected reference voltage is maintained as the final reference voltage FCV. Thus, the comparison result signal in the fine comparison mode may substantially depend on the second voltage difference between the ramp voltage and the ramp initial voltage. In the fine comparison mode, magnitude of the second voltage difference between the ramp voltage and the ramp initial voltage may be increased. Thus, the analog to digital converter 100 may check whether the comparison result signal is changed from a second polarity to a first polarity (Step S230). If the polarity of the comparison result signal does not change from a second polarity to a first polarity, Steps S210, S220, and S230 may be performed again. If the polarity of the comparison result signal is changed from a second polarity to a first polarity, the least significant bits may be calculated by counting the clock signal (Step S240) after the polarity of the comparison result signal is changed from a second polarity to a first polarity in the fine comparison mode (i.e., the second timing point) until the fine comparison mode is finished (i.e., the end timing point of the fine comparison mode). For example, when the reference voltages (i.e., the first through (n)th reference voltage) are decreased by the predetermined voltage as n increases, the polarity of the comparison result signal may be changed from a negative polarity to a positive polarity at the second timing point. When the reference voltages (i.e., the first through (n)th reference voltage) are increased by the predetermined voltage as n increases, the polarity of the comparison result signal may be changed at the second timing point.

Figure 10:
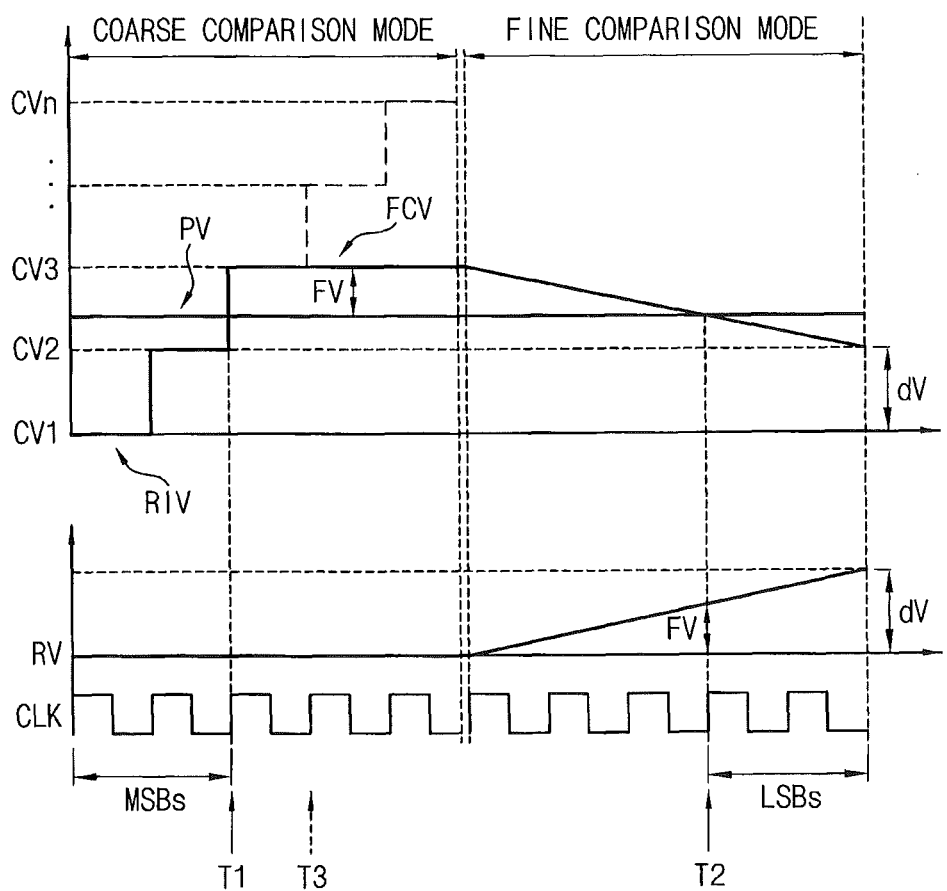
FIG. 10 is a timing diagram illustrating an example of an operation of an analog to digital converter of FIG. 1.

FIG. 10 is a timing diagram illustrating an example of an operation of an analog to digital converter of FIG. 1.

Referring to FIG. 10, the analog to digital converter 100 may operate a dual mode of the coarse comparison mode and the fine comparison mode. The clock signal CLK may be input for calculating the MSBs and the LSBs in the coarse comparison mode and the fine comparison mode. The ramp initial voltage RIV may correspond to the first reference voltage CV1. The ramp voltage RV may be maintained as the ramp initial voltage RIV in the coarse comparison mode, and may be increased with a predetermined slope in the fine comparison mode. As illustrated in FIG. 10, the reference voltages (i.e., the first through (n)th reference voltage CV1 through CVn) may be candidates of the selected reference voltage CV. The reference voltages (i.e., the first through (n)th reference voltage CV1 through CVn) may be increased by the predetermined voltage dV as n increases. The first through (n)th reference voltage CV1 through CVn may be sequentially selected as the selected reference voltage CV. In one example embodiment, the ramp voltage RV may be increased at a predetermined slope by integer times of the predetermined voltage dV in the fine comparison mode. As a result, the analog to digital converter 100 may have an enough comparison margin in the fine comparison mode. In FIG. 10, it is illustrated that the ramp voltage RV is increased at a predetermined slope by the predetermined voltage dV in the fine comparison mode. If an amount that the ramp voltage RV is increased by is relatively large, a signal conversion speed of the analog to digital converter 100 may be relatively slow because the fine comparison mode is delayed. That is, there is a trade-off between the comparison margin and the signal conversion speed of the analog to digital converter 100.

In the coarse comparison mode, the analog to digital converter 100 may select the selected reference voltage CV by sequentially outputting the first through (n)th reference voltage CV1 through CVn. For example, when the first reference voltage CV1 is selected as the selected reference voltage CV, the first reference voltage CV1 may be compared with the pixel output voltage PV. Thus, the comparison result signal CRS may have a first polarity (e.g., a negative polarity) because the pixel output voltage PV is greater than the first reference voltage CV1. Then, when the second reference voltage CV2 is selected as the selected reference voltage CV, the second reference voltage CV2 may be compared with the pixel output voltage PV. Thus, the comparison result signal CRS may also have a first polarity (e.g., a negative polarity) because the pixel output voltage PV is greater than the second reference voltage CV2. Then, when the third reference voltage CV3 is selected as the selected reference voltage CV, the third reference voltage CV3 may be compared with the pixel output voltage PV. Thus, the comparison result signal CRS may have a second polarity (e.g., a positive polarity) because the pixel output voltage PV is smaller than the third reference voltage CV3. Here, the final reference voltage FCV may be determined based on the first timing point T1 at which the polarity of the comparison result signal CRS is changed from a first polarity (e.g., a negative polarity) to a second polarity (e.g., a positive polarity). In FIG. 10, the third reference voltage CV3 may be determined as the final reference voltage FCV because the third reference voltage CV3 is selected as the selected reference voltage CV at the first timing point T1. The analog to digital converter 100 may calculate the MSBs by counting the clock signal CLK from the start timing point of the coarse comparison mode to the first timing point T1.

In the fine comparison mode, the comparison result signal CRS may be changed as the ramp voltage RV is increased at a predetermined slope. For example, when the third reference voltage CV3 is determined as the final reference voltage FCV, the first voltage difference between the final reference voltage FCV and the pixel output voltage PV may be a specific voltage FV at the start timing point of the fine comparison mode. The second voltage difference between the ramp voltage RV and the ramp initial voltage RIV may be zero at the start timing point of the fine comparison mode. The comparison result signal CRS may be continuously generated based on the final reference voltage FCV, the pixel output voltage PV, the ramp initial voltage RIV, and the ramp voltage RV.

As describe above, the comparison result signal CRS may be generated using the [Expression 1]. Here, the comparison result signal CRS may be gradually decreased because the ramp voltage RV is gradually increased at a predetermined slope. The analog to digital converter 100 may generate the LSBs by counting the clock signal CLK from the second timing point T2 to the end timing point of the fine comparison mode. As described above, the polarity of the comparison result signal CRS changes from a second polarity (e.g., a positive polarity) to a first polarity (e.g., a negative polarity) at the second timing point T2. The analog to digital converter 100 may generate the digital signal DS corresponding to the pixel output voltage PV by summing the MSBs and the LSBs. Since a calculation of the MSBs and the LSBs is an example, the calculation of the MSBs and the LSBs is not limited thereto. For example, the analog to digital converter 100 may calculate the MSBs by counting the clock signal CLK from the start timing point of the coarse comparison mode to the third timing point T3, may calculate the LSBs by counting the clock signal CLK from the start timing point of the fine comparison mode to the second timing point T2, and may generate the digital signal DS by subtracting the LSBs from the MSBs.

Figure 11:
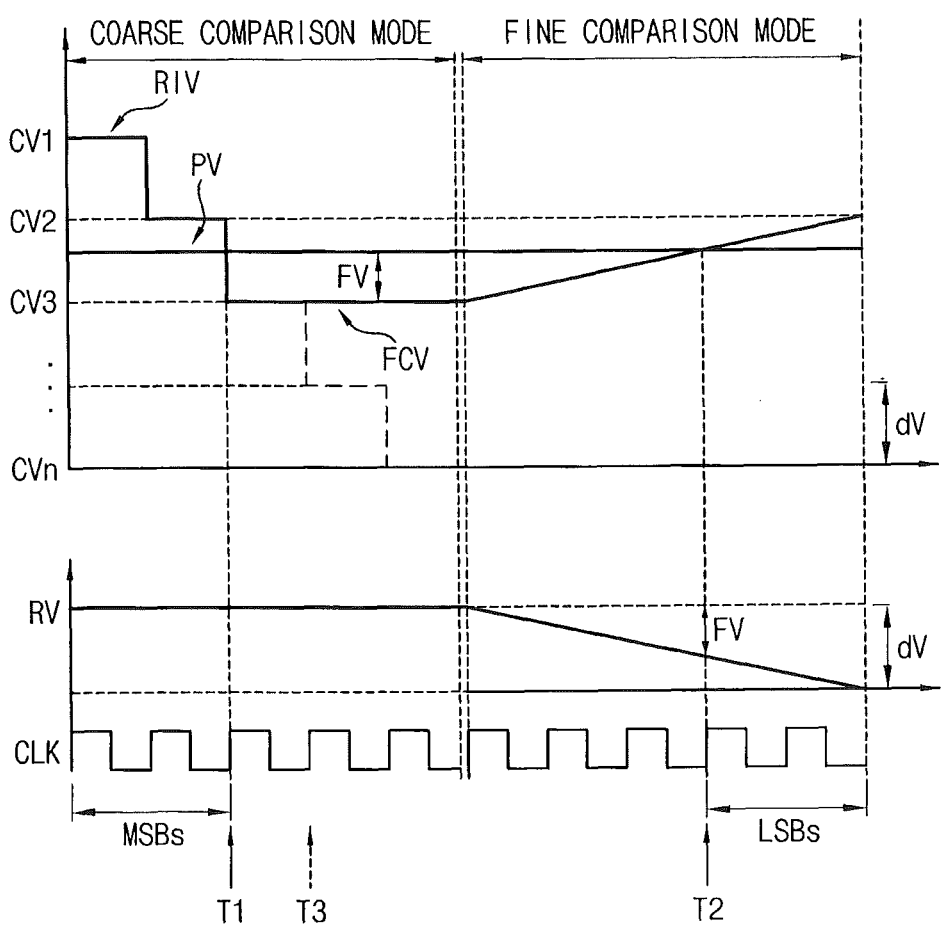
FIG. 11 is a timing diagram illustrating another example of an operation of an analog to digital converter of FIG. 1.

FIG. 11 is a timing diagram illustrating another example of an operation of an analog to digital converter of FIG. 1.

Referring to FIG. 11, the analog to digital converter 100 may operate a dual mode of the coarse comparison mode and the fine comparison mode. The clock signal CLK may be input for calculating the MSBs and the LSBs in the coarse comparison mode and the fine comparison mode. The ramp initial voltage RIV may correspond to the first reference voltage CV1. The ramp voltage RV may be maintained as the ramp initial voltage RIV in the coarse comparison mode, and may be decreased at a predetermined slope in the fine comparison mode. As illustrated in FIG. 11, the reference voltages (i.e., the first through (n)th reference voltage CV1 through CVn) may be candidates of the selected reference voltage CV. The reference voltages (i.e., the first through (n)th reference voltage CV1 through CVn) may be decreased by the predetermined voltage dV as n increases. The first through (n)th reference voltage CV1 through CVn may be sequentially selected as the selected reference voltage CV. In one example embodiment, the ramp voltage RV may be decreased at a predetermined slope by integer times of the predetermined voltage dV in the fine comparison mode. Thus, the analog to digital converter 100 may have an enough comparison margin in the fine comparison mode. In FIG. 11, it is illustrated that the ramp voltage RV is decreased at a predetermined slope by the predetermined voltage dV in the fine comparison mode. If an amount that the ramp voltage RV is decreased by is relatively big, a signal conversion speed of the analog to digital converter 100 may be relatively slow because the fine comparison mode is delayed. That is, there is a trade-off between the comparison margin and the signal conversion speed of the analog to digital converter 100.

In the coarse comparison mode, the analog to digital converter 100 may select the selected reference voltage CV by sequentially outputting the first through (n)th reference voltage CV1 through CVn. For example, when the first reference voltage CV1 is selected as the selected reference voltage CV, the first reference voltage CV1 may be compared with the pixel output voltage PV. Thus, the comparison result signal CRS may have a first polarity (e.g., a positive polarity) because the pixel output voltage PV is smaller than the first reference voltage CV1. Then, when the second reference voltage CV2 is selected as the selected reference voltage CV, the second reference voltage CV2 may be compared with the pixel output voltage PV. Thus, the comparison result signal CRS may also have a first polarity (e.g., a positive polarity) because the pixel output voltage PV is smaller than the second reference voltage CV2. Then, when the third reference voltage CV3 is selected as the selected reference voltage CV, the third reference voltage CV3 may be compared with the pixel output voltage PV. Thus, the comparison result signal CRS may have a second polarity (e.g., a negative polarity) because the pixel output voltage PV is greater than the third reference voltage CV3. Here, the final reference voltage FCV may be determined based on the first timing point T1 at which the polarity of the comparison result signal CRS changes. In FIG. 11, the third reference voltage CV3 may be determined as the final reference voltage FCV because the third reference voltage CV3 is selected as the selected reference voltage CV at the first timing point T1. The analog to digital converter 100 may calculate the MSBs by counting the clock signal CLK from the start timing point of the coarse comparison mode to the first timing point T1.

In the fine comparison mode, the comparison result signal CRS may be changed as the ramp voltage RV is decreased at a predetermined slope. For example, when the third reference voltage CV3 is determined as the final reference voltage FCV, the first voltage difference between the final reference voltage FCV and the pixel output voltage PV may be a specific voltage FV at the start timing point of the fine comparison mode. In addition, the second voltage difference between the ramp voltage RV and the ramp initial voltage RIV may be zero at the start timing point of the fine comparison mode. The comparison result signal CRS may be continuously generated based on the final reference voltage FCV, the pixel output voltage PV, the ramp initial voltage RIV, and the ramp voltage RV. As describe above, the comparison result signal CRS may be generated using the [Expression 1]. Here, the comparison result signal CRS may be gradually increased because the ramp voltage RV is gradually decreased at a predetermined slope. The analog to digital converter 100 may generate the LSBs by counting the clock signal CLK from the second timing point T2 to the end timing point of the fine comparison mode. As described above, the polarity of the comparison result signal CRS changes at the second timing point T2. The analog to digital converter 100 may generate the digital signal DS corresponding to the pixel output voltage PV by summing the MSBs and the LSBs. Since a calculation of the MSBs and the LSBs is an example, the calculation of the MSBs and the LSBs is not limited thereto. For example, the analog to digital converter 100 may calculate the MSBs by counting the clock signal CLK from the start timing point of the coarse comparison mode to the third timing point T3, may calculate the LSBs by counting the clock signal CLK from the start timing point of the fine comparison mode to the second timing point T2, and may generate the digital signal DS by subtracting the LSBs from the MSBs.

Figure 12:
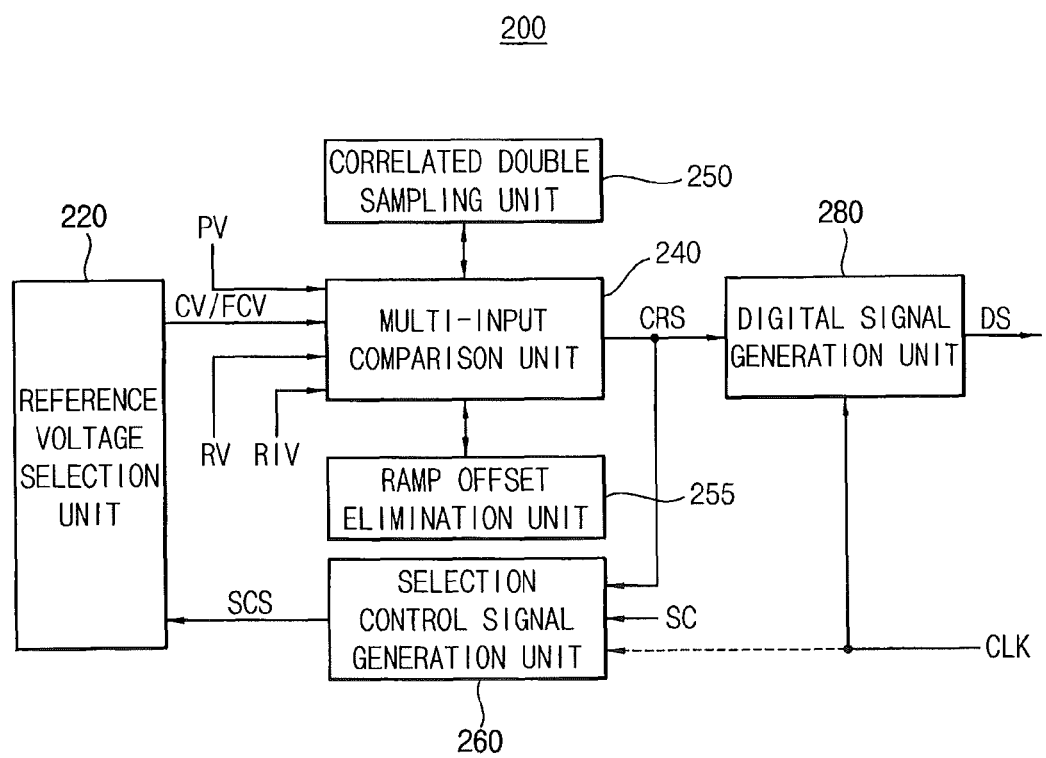
FIG. 12 is a block diagram illustrating an analog to digital converter according to some example embodiments.

FIG. 12 is a block diagram illustrating an analog to digital converter according to some example embodiments.

Referring to FIG. 12, the analog to digital converter 200 may include a reference voltage selection unit 220, a multi-input comparison unit 240, a selection control signal generation unit 260, and a digital signal generation unit 280. In addition, the analog to digital converter 200 may further include a correlated double sampling unit 250 and/or a ramp offset elimination unit 255. Since the reference voltage selection unit 220, the multi-input comparison unit 240, the selection control signal generation unit 260, and the digital signal generation unit 280 are described in FIG. 1, the description of the reference voltage selection unit 220, the multi-input comparison unit 240, the selection control signal generation unit 260, and the digital signal generation unit 280 will be omitted.

The correlated double sampling unit 250 may perform correlated double sampling operations for the pixel output voltage PV. That is, the analog to digital converter 200 having the correlated double sampling unit 250 may generate a first digital signal by performing analog to digital conversion (ADC) operations for a reset voltage, may generate a second digital signal by performing ADC operations for a conversion voltage, and may output the digital signal by subtracting the second digital signal from the first digital signal. The correlated double sampling operations may be performed to eliminate (or reduce) an offset voltage by subtracting the conversion voltage from the reset voltage because both of the reset voltage and the conversion voltage output from an unit pixel include the same offset voltage due to errors caused when an active pixel array is fabricated and/or the ADC operations are performed. Here, the reset voltage indicates the pixel output voltage PV generated by specific noises of the unit pixel, and the conversion voltage indicates the pixel output voltage PV generated by photoelectric transformations. For example, the unit pixel may have a 5-transistor structure having a photodiode, a transfer transistor, a reset transistor, a source follower transistor, a select transistor, and a bias transistor. In this case, the reset voltage may correspond to the pixel output voltage PV output via the source follower transistor and the select transistor when the transfer transistor is turned off, and the reset transistor is turned on. The conversion voltage may correspond to the pixel output voltage PV output via the transfer transistor, the source follower transistor, and the select transistor after electric charges generated by the photodiode are stored in a floating diffusion node of the unit pixel.

In one example embodiment, the correlated double sampling unit 250 may include a first capacitor and a first switch. The first capacitor may be coupled between an input terminal of the pixel output voltage PV and an input terminal of the multi-input comparison unit 240. The first switch may be coupled between the input terminal of the multi-input comparison unit 240 and an output terminal of the multi-input comparison unit 240. The first switch may be turned on in an auto zero mode, may be turned off in the coarse comparison mode and the fine comparison mode of the ADC operations for the reset voltage and the conversion voltage. In the auto zero mode, the correlated double sampling unit 250 may connect the input terminal of the pixel output voltage PV to the output terminal of the multi-input comparison unit 240 via the first capacitor by turning on the first switch. As a result, the ADC operations for the reset voltage and the conversion voltage may be ready because the input terminal of the multi-input comparison unit 240 is coupled to the output terminal of the multi-input comparison unit 240.

In the coarse comparison mode and the fine comparison mode of the ADC operations for the reset voltage and the conversion voltage, the correlated double sampling unit 250 may disconnect the input terminal of the multi-input comparison unit 240 from the output terminal of the multi-input comparison unit 240 by turning off the first switch. As a result, the multi-input comparison unit 240 may generate the comparison result signal CRS based on the selection reference voltage CV, the pixel output voltage PV, the ramp initial voltage RIV, and the ramp voltage RV. As described above, the analog to digital converter 200 having the correlated double sampling unit 250 may eliminate (or reduce) the offset voltage because the digital signal DS is generated by subtracting the second digital signal corresponding to the conversion voltage from the first digital signal corresponding to the reset voltage.

The ramp offset elimination unit 255 may perform ramp offset elimination operations for the ramp initial voltage RIV and the ramp voltage RV. That is, the ramp offset elimination unit 255 may eliminate an offset voltage between the ramp initial voltage RIV and the ramp voltage RV by coupling an input terminal of the ramp voltage RV to the input terminal of the multi-input comparison unit 240. As described above, the multi-input comparison unit 240 may generate the comparison result signal CRS based on the selection reference voltage CV, the pixel output voltage PV, the ramp initial voltage RIV, and the ramp voltage RV. In the coarse comparison mode, the ramp voltage RV should have the same voltage level as the ramp initial voltage RIV. However, the offset voltage between the ramp voltage RV and the ramp initial voltage RIV may be generated by external noise. Thus, the voltage level of the ramp voltage RV may be different from the voltage level of the ramp initial voltage RIV in the coarse comparison mode. The ramp offset elimination unit 255 may eliminate (or reduce) the offset voltage between the ramp initial voltage RIV and the ramp voltage RV in the auto zero mode. In one example embodiment, the ramp offset elimination unit 255 may include a second capacitor and a second switch. The second capacitor may be coupled between an input terminal of the ramp initial voltage RIV and the input terminal of the multi-input comparison unit 240. The second switch may be coupled between the input terminal of the ramp voltage RV and the input terminal of the multi-input comparison unit 240. In the auto zero mode, the second switch may be turned on. In the coarse comparison mode and the fine comparison mode of the ADC operations for the reset voltage and the conversion voltage, the second switch may be turned off. As a result, the offset voltage between the ramp voltage RV and the ramp initial voltage RIV may be eliminated because the input terminal of the ramp voltage RV, the input terminal of the ramp initial voltage RIV, and the input terminal of the multi-input comparison unit 240 are connected via the second capacitor.

The analog to digital converter 200 may prevent (or reduce) offset mismatching and ramp voltage slope mismatching because the analog to digital converter 200 uses one ramp voltage RV, and may prevent (or reduce) time noise and unnecessary power consumption because the analog to digital converter 200 includes a multi-input comparator 240 without sampling capacitors. Since a feedback operation is performed among the reference voltage selection unit 220, the multi-input comparator 240, the selection control signal generation unit 260, and the digital signal generation unit 280 (i.e., a loop is formed), the analog to digital converter 200 may operate in a dual mode including the coarse comparison mode and the fine comparison mode based on one ramp voltage RV. In addition, the analog to digital converter 200 may eliminate (or reduce) the offset voltage due to errors caused when an active pixel array is fabricated and/or the ADC operations are performed, and may eliminate the offset voltage between the ramp voltage RV and the ramp initial voltage RIV. As a result, an image sensor having the analog to digital converter 100 may generate a high-quality image. Further, the analog to digital converter 200 may have a simple structure. Thus, the analog to digital converter 200 may reduce power consumption and signal conversion time although a frame rate, a bit resolution, and the number of unit pixels in the image sensor are increased. In an image sensor, the number of the analog to digital converters 200 may be the same as the number of column lines coupled to an active pixel array. The column lines may be coupled to the analog to digital converters 200, respectively.

Figure 13:
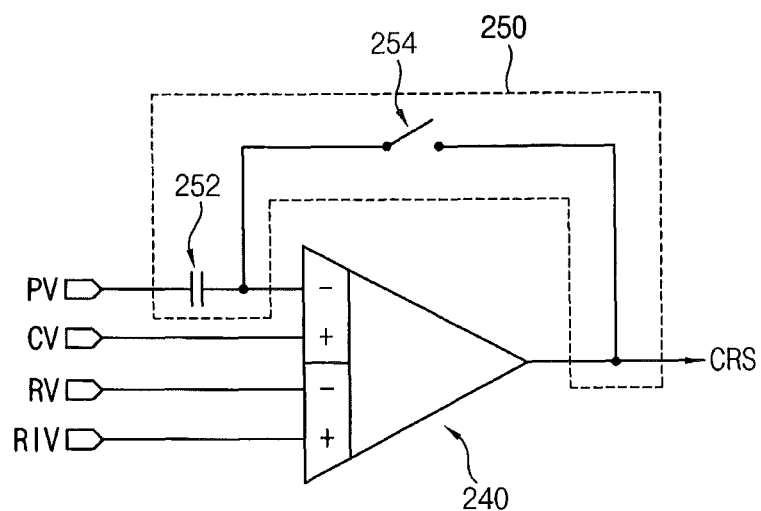
FIG. 13 is a circuit diagram illustrating an example of a correlated double sampling unit in an analog to digital converter of FIG. 12.

FIG. 13 is a circuit diagram illustrating an example of a correlated double sampling unit in an analog to digital converter of FIG. 12.

Referring to FIG. 13, the correlated double sampling unit 250 may include a first capacitor 252 and a first switch 254. As described above, the correlated double sampling unit 250 may perform the correlated double sampling operations for the pixel output voltage PV.

The first capacitor 252 may be coupled between the input terminal of the pixel output voltage PV and the input terminal of the multi-input comparison unit 240. That is, a first terminal of the first capacitor 252 may be coupled to the input terminal of the pixel output voltage PV, and a second terminal of the first capacitor 252 may be coupled to the input terminal of the multi-input comparison unit 240 and a first terminal of the first switch 254. The first switch 254 may be coupled between the input terminal of the multi-input comparison unit 240 and the output terminal of the multi-input comparison unit 240. That is, the first terminal of the first switch 254 may be coupled to the second terminal of the first capacitor 252, and a second terminal of the first switch 254 may be coupled to the output terminal of the multi-input comparison unit 240. In the auto zero mode, the first switch 254 may be turned on. In the coarse comparison mode and the fine comparison mode of the ADC operations for the reset voltage and the conversion voltage, the first switch 254 may be turned off. As a result, the ADC operations for the reset voltage and the conversion voltage may be ready because the input terminal of the multi-input comparison unit 240 is coupled to the output terminal of the multi-input comparison unit 240. Subsequently, the multi-input comparison unit 240 may generate the comparison result signal CRS based on the selected reference voltage CV, the pixel output voltage PV, the ramp initial voltage RIV, and the ramp voltage RV in the coarse comparison mode and the fine comparison mode of the ADC operations for the reset voltage and the conversion voltage. Thus, the analog to digital converter 200 having the correlated double sampling unit 250 may accurately convert the analog signal (i.e., the reset voltage–the conversion voltage) to the digital signal DS. Since a structure of the correlated double sampling unit 250 is an example, the structure of the correlated double sampling unit 250 may be variously changed according to required conditions.

Figure 14:
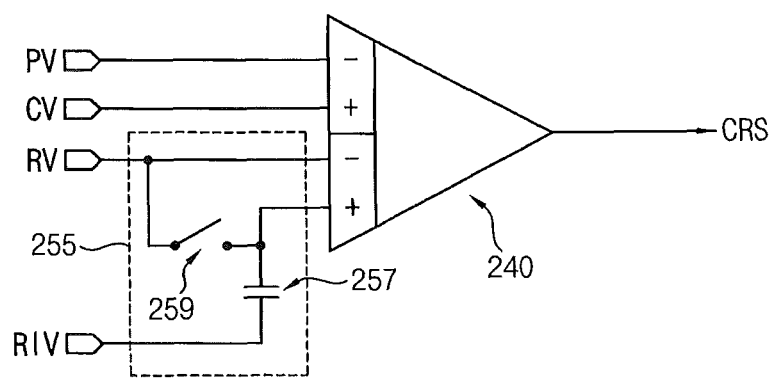
FIG. 14 is a circuit diagram illustrating an example of a ramp offset elimination unit in an analog to digital converter of FIG. 12.

FIG. 14 is a circuit diagram illustrating an example of a ramp offset elimination unit in an analog to digital converter of FIG. 12.

Referring to FIG. 14, the ramp offset elimination unit 255 may include a second capacitor 257 and a second switch 259. As described above, the ramp offset elimination unit 255 may perform the ramp offset elimination operations for the ramp initial voltage RIV and the ramp voltage RV.

The second capacitor 257 may be coupled between the input terminal of the ramp initial voltage RIV and the input terminal of the multi-input comparison unit 240. That is, a first terminal of the second capacitor 257 may be coupled to the input terminal of the ramp initial voltage RIV, and a second terminal of the second capacitor 257 may be coupled to a first input terminal of the multi-input comparison unit 240. The second switch 259 may be coupled between the input terminal of the ramp voltage RV and the input terminal of the multi-input comparison unit 240. That is, a first terminal of the second switch 259 may be coupled to the input terminal of the ramp voltage RV, and a second terminal of the second switch 259 may be coupled to the second terminal of the second capacitor 257. The input terminal of the ramp voltage RV may be coupled to a second input terminal of the multi-input comparison unit 240. In the auto zero mode, the second switch 259 may be turned on. In the coarse comparison mode and the fine comparison mode of the ADC operations for the reset voltage and the conversion voltage, the second switch 259 may be turned off. As a result, the offset voltage between the ramp voltage RV and the ramp initial voltage RIV may be eliminated because the input terminal of the ramp voltage RV, the input terminal of the ramp initial voltage RIV, and the first and second input terminal of the multi-input comparison unit 240 are connected via the second capacitor 257 in the auto zero mode. Thus, the analog to digital converter 200 having the ramp offset elimination unit 255 may accurately convert the analog signal (i.e., the pixel output voltage PV) to the digital signal DS. Since a structure of the ramp offset elimination unit 255 is an example, the structure of the ramp offset elimination unit 255 may be variously changed according to required conditions.

Figure 15:
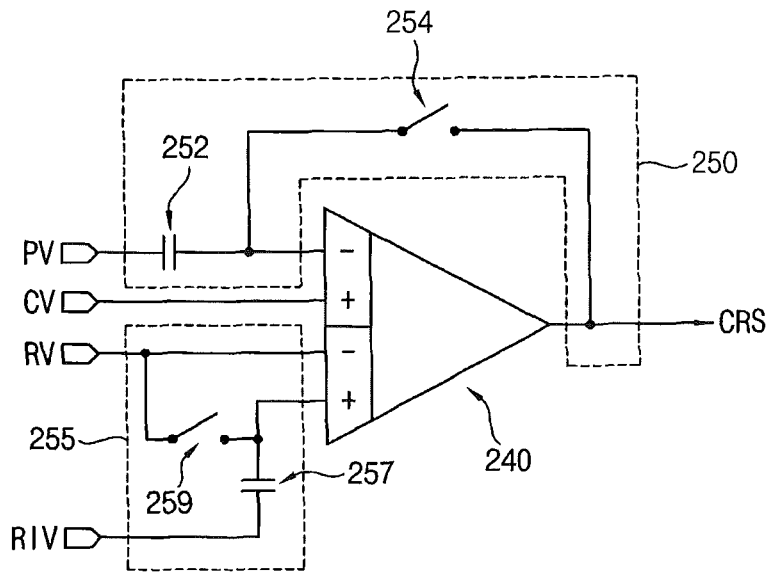
FIG. 15 is a circuit diagram illustrating an example of a correlated double sampling unit and a ramp offset elimination unit in an analog to digital converter of FIG. 12.

FIG. 15 is a circuit diagram illustrating an example of a correlated double sampling unit and a ramp offset elimination unit in an analog to digital converter of FIG. 12.

Referring to FIG. 15, the analog to digital converter 200 may include both of the correlated double sampling unit 250 and the ramp offset elimination unit 255. As described above, the correlated double sampling unit 250 may perform the correlated double sampling operations for the pixel output voltage PV, and the ramp offset elimination unit 255 may perform the ramp offset elimination operations for the ramp initial voltage RIV and the ramp voltage RV. Since the correlated double sampling unit 250 and the ramp offset elimination unit 255 are described in FIG. 13 and FIG. 14, description of the correlated double sampling unit 250 and the ramp offset elimination unit 255 will be omitted.

Figure 16:
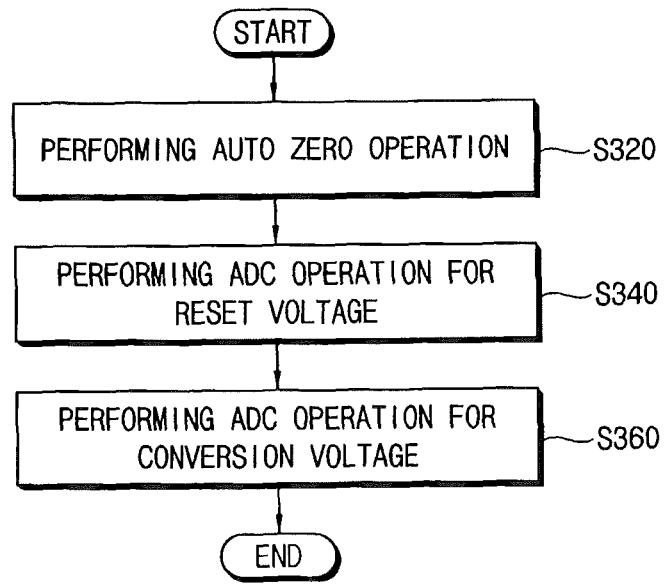
FIG. 16 is a flow chart illustrating an operation of an analog to digital converter of FIG. 12.

FIG. 16 is a flow chart illustrating an operation of an analog to digital converter of FIG. 12.

Referring to FIG. 16, the analog to digital converter 200 may perform auto zero operations (Step S320). Subsequently, the analog to digital converter 200 may ADC operations for the reset voltage (Step S340), and may ADC operations for the conversion voltage (Step S360). The analog to digital converter 200 may include the correlated double sampling unit 250 to perform the correlated double sampling operations. That is, by performing the auto zero operations, the analog to digital converter 200 may eliminate (or reduce) the offset voltage between the ramp voltage RV and the ramp initial voltage RIV to be ready for the coarse comparison mode and the fine comparison mode of the ADC operations. Then, the analog to digital converter 200 may generate the first digital signal by performing the ADC operations for the reset voltage, may generate the second digital signal by performing the ADC operations for the conversion voltage, and may generate the digital signal DS by subtracting the second digital signal from the first digital signal.

Figure 17:
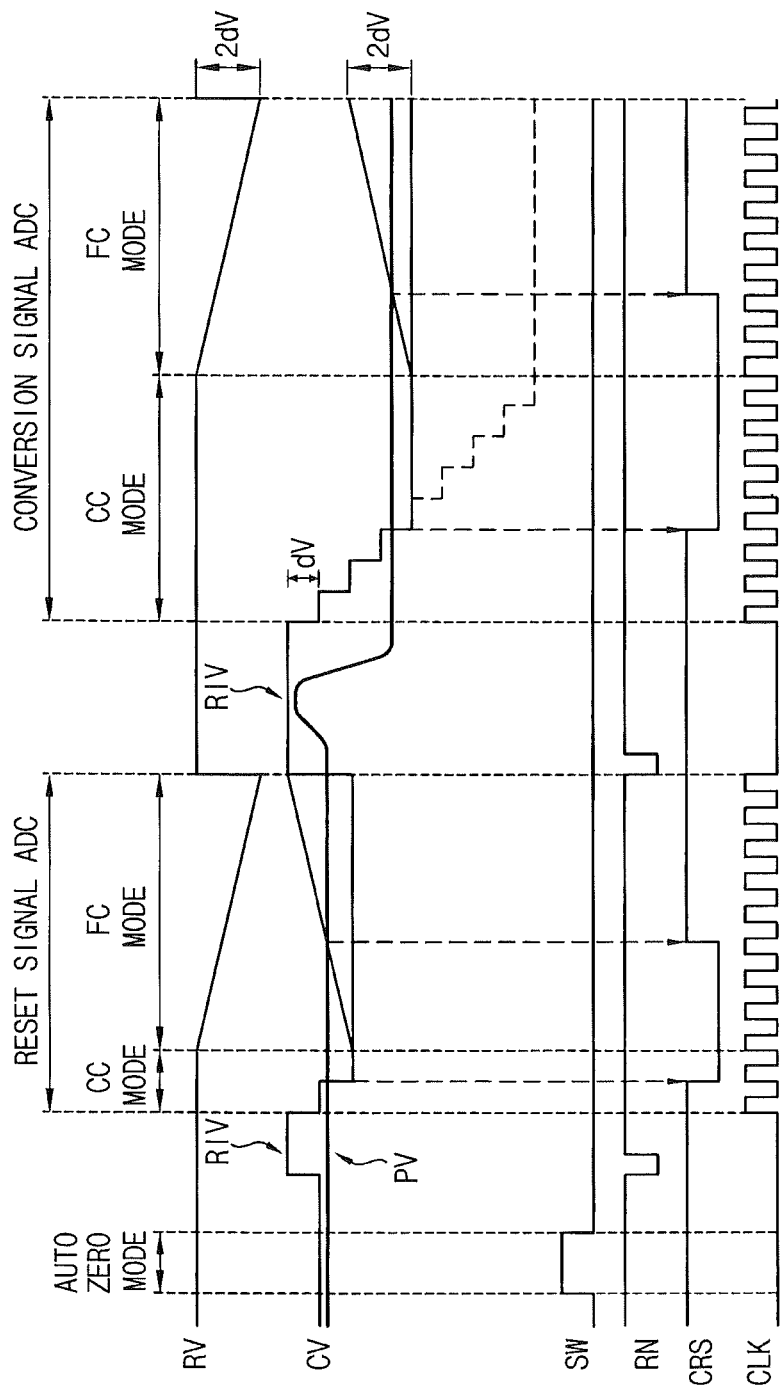
FIG. 17 is a timing diagram illustrating an example of an operation of an analog to digital converter of FIG. 12.

FIG. 17 is a timing diagram illustrating an example of an operation of an analog to digital converter of FIG. 12.

Referring to FIG. 17, the analog to digital converter 200 may perform the auto zero operations. Subsequently, the analog to digital converter 200 may perform the ADC operations for the reset voltage, and may perform the ADC operations for the conversion voltage. As illustrated in FIG. 17, when the analog to digital converter 200 performs the ADC operations for the reset voltage, the analog to digital converter 200 may operate a dual mode of the coarse comparison mode CC MODE and the fine comparison mode FC MODE. Similarly, when the analog to digital converter 200 performs the ADC operations for the conversion voltage, the analog to digital converter 200 may operate a dual mode of the coarse comparison mode CC MODE and the fine comparison mode FC MODE. The analog to digital converter 200 may generate the first digital signal by performing the ADC operations for the reset voltage, may generate the second digital signal by performing the ADC operations for the conversion voltage, and may generate the digital signal DS by subtracting the second digital signal from the first digital signal. That is, the analog to digital converter 200 may perform the correlated double sampling operations. First, the analog to digital converter 200 may perform the auto zero operations before performing the ADC operations for the reset voltage and the conversion voltage. In one example embodiment, the auto zero operations may be performed by turning on the first switch of the correlated double sampling unit 250 based on a switching signal SW (e.g., an activation of the switching signal SW) output from a timing control circuit of an image sensor. As a result, the ADC operations for the reset voltage and the conversion voltage may be ready because the input terminal of the multi-input comparison unit 240 is connected to the output terminal of the multi-input comparison unit 240 by the correlated double sampling unit 250. Then, the auto zero operations may be finished based on the switching signal SW (e.g., a deactivation of the switching signal SW) output from the timing control circuit of the image sensor.

The analog to digital converter 200 may initiate the reference voltage selection unit 220 based on an initial control voltage RN output from the timing control circuit of the image sensor. Here, the first reference voltage may be determined. The first reference voltage may correspond to the ramp initial voltage RIV. Subsequently, the ADC operations for the reset voltage may be performed. The analog to digital converter 200 may perform the ADC operations for the reset voltage by operating a dual mode including the coarse comparison mode and the fine comparison mode. In the coarse comparison mode, the reference voltages (i.e., the first through (n)th reference voltage CV1 through CVn) may be sequentially selected as the selected reference voltage CV, and the selected reference voltage CV may be determined as the final reference voltage based on the first timing point at which the polarity of the comparison result signal CRS changes from a first polarity to a second polarity. In FIG. 17, the reference voltages (i.e., the first through (n)th reference voltages CV1 through CVn) are decreased by a predetermined voltage dV as n increases. The comparison result signal CRS may be continuously generated based on the selected reference voltage CV, the pixel output voltage PV, the ramp initial voltage RIV, and the ramp voltage RV. For example, the comparison result signal CRS may be generated using the [Expression 1]. The analog to digital converter 200 may generate the MSBs of the reset voltage (i.e., the pixel output voltage PV) by counting the clock signal CLK from the start timing point of the coarse comparison mode to the first timing point at which the polarity of the comparison result signal CRS is changed from a first polarity (e.g., a positive polarity) to a second polarity (e.g., a negative polarity). In the fine comparison mode, the comparison result signal CRS may be changed as the ramp voltage RV is decreased with a predetermined slope. The ramp voltage RV may be decreased with a predetermined slope by integer times of the predetermined voltage dV in the fine comparison mode. In FIG. 17, it is illustrated that the ramp voltage RV is decreased with a predetermined slope by two times of the predetermined voltage dV in the fine comparison mode. In the fine comparison mode, the comparison result signal CRS may be continuously generated based on the final reference voltage FCV, the pixel output voltage PV, the ramp initial voltage RIV, and the ramp voltage RV. For example, the comparison result signal CRS may be generated using the [Expression 1]. The analog to digital converter 200 may generate the LSBs of the reset voltage (i.e., the pixel output voltage PV) by counting the clock signal CLK from the second timing point at which the polarity of the comparison result signal CRS changes from a second polarity (e.g., a negative polarity) to a first polarity (e.g., a positive polarity) to the end timing point of the fine comparison mode. The analog to digital converter 200 may generate the first digital signal corresponding to the reset voltage by summing the MSBs of the reset voltage and the LSBs of the reset voltage.

The analog to digital converter 200 may initiate the reference voltage selection unit 220 based on the initial control voltage RN output from the timing control circuit of the image sensor. Here, the first reference voltage may be determined. The first reference voltage may correspond to the ramp initial voltage RIV. Subsequently, the ADC operations for the conversion voltage may be performed. The analog to digital converter 200 may perform the ADC operations for the conversion voltage by operating a dual mode of the coarse comparison mode and the fine comparison mode. In the coarse comparison mode, the reference voltages (i.e., the first through (n)th reference voltage CV1 through CVn) may be sequentially selected as the selected reference voltage CV, and the selected reference voltage CV may be determined as the final reference voltage based on the first timing point at which the polarity of the comparison result signal CRS is changed from a first polarity to a second polarity. In FIG. 17, the reference voltages (i.e., the first through (n)th reference voltage CV1 through CVn) are decreased by a predetermined voltage dV as n increases. The comparison result signal CRS may be continuously generated based on the selected reference voltage CV, the pixel output voltage PV, the ramp initial voltage RIV, and the ramp voltage RV. For example, the comparison result signal CRS may be generated using the [Expression 1]. The analog to digital converter 200 may generate the MSBs of the conversion voltage (i.e., the pixel output voltage PV) by counting the clock signal CLK from the start timing point of the coarse comparison mode to the first timing point at which the polarity of the comparison result signal CRS changes from a first polarity (e.g., a positive polarity) to a second polarity (e.g., a negative polarity). In the fine comparison mode, the comparison result signal CRS may be changed as the ramp voltage RV is decreased at a predetermined slope. The ramp voltage RV may be decreased at a predetermined slope by an integer times the predetermined voltage dV in the fine comparison mode. In FIG. 17, it is illustrated that the ramp voltage RV is decreased at a predetermined slope by two times of the predetermined voltage dV in the fine comparison mode. In the fine comparison mode, the comparison result signal CRS may be continuously generated based on the final reference voltage FCV, the pixel output voltage PV, the ramp initial voltage RIV, and the ramp voltage RV. For example, the comparison result signal CRS may be generated using the [Expression 1]. The analog to digital converter 200 may generate the LSBs of the conversion voltage (i.e., the pixel output voltage PV) by counting the clock signal CLK from the second timing point at which the polarity of the comparison result signal CRS is changed from a second polarity (e.g., a negative polarity) to a first polarity (e.g., a positive polarity) to the end timing point of the fine comparison mode. Then, the analog to digital converter 200 may generate the first digital signal corresponding to the conversion voltage by summing the MSBs of the conversion voltage and the LSBs of the conversion voltage. The analog to digital converter 200 may output the digital signal DS by subtracting the second digital signal corresponding to the conversion voltage from the first digital signal corresponding to the reset voltage.

Figure 18:
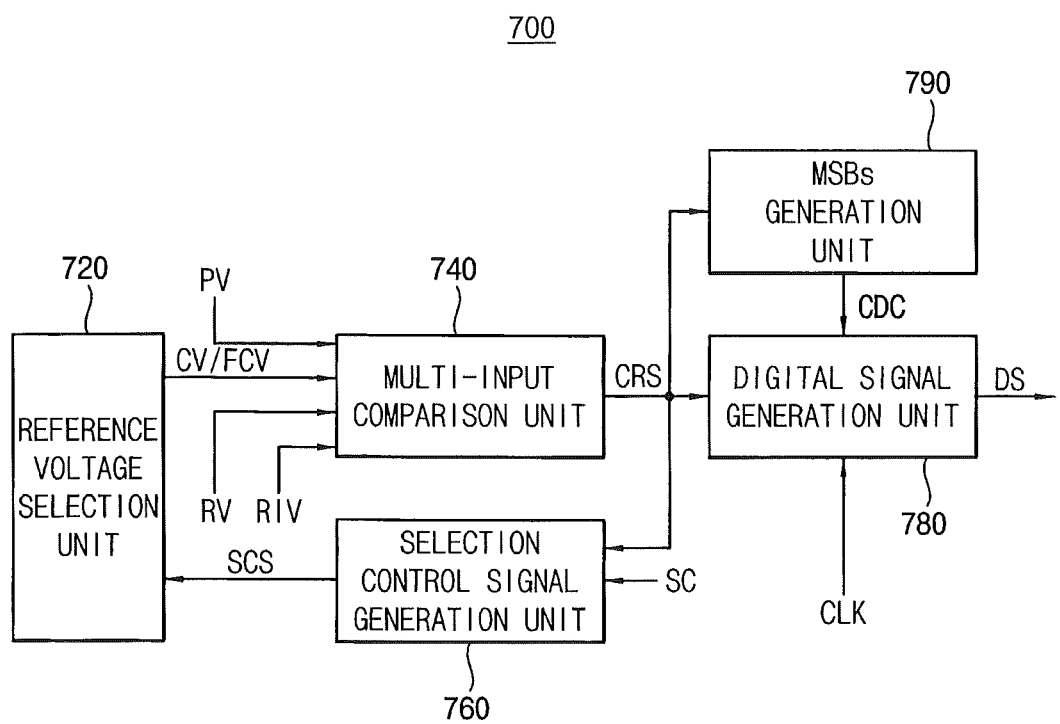
FIG. 18 is a block diagram illustrating an analog to digital converter according to some example embodiments.

FIG. 18 is a block diagram illustrating an analog to digital converter according to some example embodiments.

Referring to FIG. 18, the analog to digital converter 700 may include a reference voltage selection unit 720, a multi-input comparison unit 740, a selection control signal generation unit 760, a digital signal generation unit 780, and a most significant bits (MBSs) generation unit 790.

The reference voltage selection unit 720 may output a selected reference voltage CV by selecting one of a plurality of reference voltages based on a selection control signal SCS. The selection control signal SCS for updating the selected reference voltage CV may be input until a final reference voltage FCV is determined in a coarse comparison mode, and the selection control signal SCS for maintaining the selected reference voltage CV may be input after the final reference voltage FCV is determined in the coarse comparison mode until a fine comparison mode is finished. In one example embodiment, the reference voltages may include a first through (n)th reference voltage. Here, n is an integer greater than 1. The reference voltages may be increased or decreased by a predetermined voltage as n increases. The reference voltage selection unit 720 may select one of the reference voltages (i.e., the first through (n)th reference voltage) as the selected reference voltage CV using a binary search tree algorithm until the final reference voltage FCV is determined in the coarse comparison mode. Thus, since the binary search tree algorithm reduces the time for the coarse comparison mode, the analog to digital converter 700 may operate at high speed compared to sequentially selecting the reference voltages (i.e., the first through (n)th reference voltage) as the selected reference voltage CV.

The multi-input comparison unit 740 may generate the comparison result signal CRS based on the selected reference voltage CV, the pixel output voltage PV, the ramp initial voltage RIV, and the ramp voltage RV. The multi-input comparison unit 740 may include a plurality input terminals for receiving the selected reference voltage CV, the pixel output voltage PV, the ramp initial voltage RIV, and the ramp voltage RV. When the multi-input comparison unit 740 generates the comparison result signal CRS, the second voltage difference between the ramp voltage RV and the ramp initial voltage RIV may be zero. Thus, the comparison result signal CRS in the coarse comparison mode may substantially depend on the first voltage difference between the selected reference voltage CV and the pixel output voltage PV. When the multi-input comparison unit 740 generates the comparison result signal CRS, the pixel output voltage PV may be fixed, and the selected reference voltage CV may be maintained as the final reference voltage FCV. Thus, the comparison result signal CRS in the fine comparison mode may substantially depend on the second voltage difference between the ramp voltage RV and the ramp initial voltage RIV.

The selection control signal generation unit 760 may generate the selection control signal SCS based on the comparison result signal CRS and a comparison mode signal SC. For example, the coarse comparison mode may correspond to a period in which the comparison mode signal SC has a first logic level, and the fine comparison mode may correspond to a period in which the comparison mode signal SC has a second logic level. In detail, the selection control signal generation unit 760 may output the selection control signal SCS for updating the selected reference voltage CV until the final reference voltage FCV is determined based on the first timing point at which the magnitude of the comparison result signal CRS has a minimum value. In addition, the selection control signal generation unit 760 may output the selection control signal SCS for maintaining the final reference voltage FCV after the final reference voltage FCV (i.e., the selected reference voltage CV at the first timing point) is determined based on the first timing point until the fine comparison mode is finished.

The MSBs generation unit 790 may generate a most significant bits CDC based on the comparison result signal CRS in the coarse comparison mode. Here, a successive approximation method may be employed. The MSBs generation unit 790 may have a predetermined mapping table between the most significant bits CDC and the reference voltages (i.e., the first through (n)th reference voltage). Then, the MSBs generation unit 790 may output the most significant bits CDC corresponding to the final reference voltage FCV when one of the reference voltages (i.e., the first through (n)th reference voltage) is determined as the final reference voltage FCV. For example, the MSBs generation unit 790 may determine the selected reference voltage CV as the final reference voltage FCV when the magnitude of the comparison result signal CRS becomes a value within a predetermined range in the coarse comparison mode. Then, the MSBs generation unit 790 may output the most significant bits CDC corresponding to the final reference voltage FCV according to the predetermined mapping table.

The digital signal generation unit 780 may generate the least significant bits FDC by counting the clock signal CLK (i.e., a clock signal counting method) based on the comparison result signal CRS in the fine comparison mode, and may generate a digital signal DS corresponding to the pixel output voltage PV based on the most significant bits CDC output from the MSBs generation unit 790 and the least significant bits FDC calculated by the digital signal generation unit 780. For example, the digital signal generation unit 780 may output the digital signal DS corresponding to the pixel output voltage PV by summing the most significant bits CDC and the least significant bits FDC.

Figure 19:
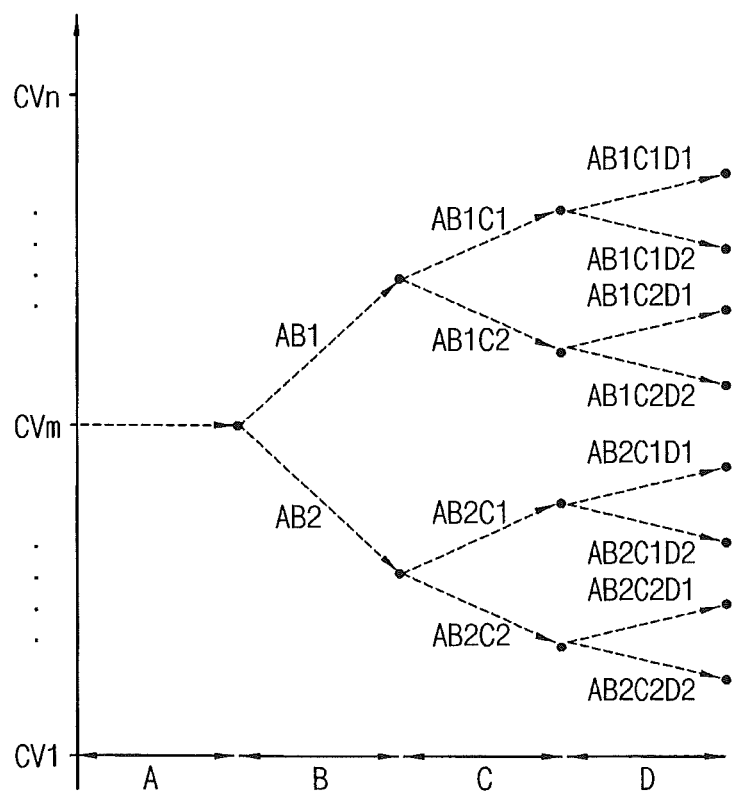
FIG. 19 is a diagram illustrating an example of determining a selected reference voltage based on a binary search tree algorithm in an analog to digital converter of FIG. 18.

FIG. 19 is a diagram illustrating an example of determining a selected reference voltage based on a binary search tree algorithm in an analog to digital converter of FIG. 18.

Referring to FIG. 19, the selected reference voltage CV may be determined among the reference voltages (i.e., the first through (n)th reference voltage CV1 through CVn) by the binary search tree algorithm in the coarse comparison mode. For example, in a first loop A, a (m)th reference voltage CVm corresponding to a half value between the first reference voltage CV1 and the (n)th reference voltage CVn may be selected as the selected reference voltage CV. If the comparison result signal CRS has a first polarity, a half value between the (m)th reference voltage CVm and the (n)th reference voltage CVn may be selected as the selected reference voltage CV in a second loop B (i.e., AB1). If the comparison result signal CRS has a second polarity, a half value between the first reference voltage CV1 and the (m)th reference voltage CVm may be selected as the selected reference voltage CV in the second loop B (i.e., AB2). Similarly, the selected reference voltage CV may be continuously changed in a third loop C, a fourth loop D, etc. As described above, the analog to digital converter 700 may determine the final reference voltage FCV at high speed because the analog to digital converter 700 change the selected reference voltage CV using the binary search tree algorithm in the coarse comparison mode. Thus, since the binary search tree algorithm reduces the time for the coarse comparison mode, the analog to digital converter 700 may perform ADC operations at high speed.

Figure 20:
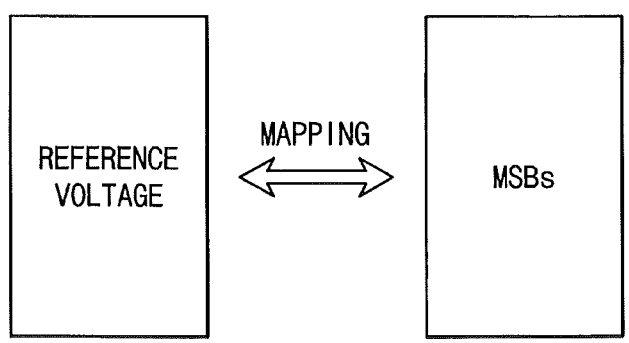
FIG. 20 is a block diagram illustrating an example of calculating most significant bits in an analog to digital converter of FIG. 18.

FIG. 20 is a block diagram illustrating an example of calculating most significant bits in an analog to digital converter of FIG. 18.

Referring to FIG. 20, the MSBs generation unit 790 of the analog to digital converter 700 may generate the most significant bits CDC based on the comparison result signal CRS in the coarse comparison mode. Here, a successive approximation method may be employed. The MSBs generation unit 790 may set the mapping table between the most significant bits CDC and the reference voltages (i.e., the first through (n)th reference voltage). Then, the MSBs generation unit 790 may output the most significant bits CDC corresponding to the final reference voltage FCV when one of the reference voltages (i.e., the first through (n)th reference voltage) is determined as the final reference voltage FCV. The digital signal generation unit 780 of the analog to digital converter 700 may generate the least significant bits FDC by counting the clock signal CLK in the fine coarse comparison mode. The digital signal DS corresponding to the pixel output voltage PV may be generated based on the most significant bits CDC output from the MSBs generation unit 790 and the least significant bits FDC calculated by the digital signal generation unit 780.

Figure 21:
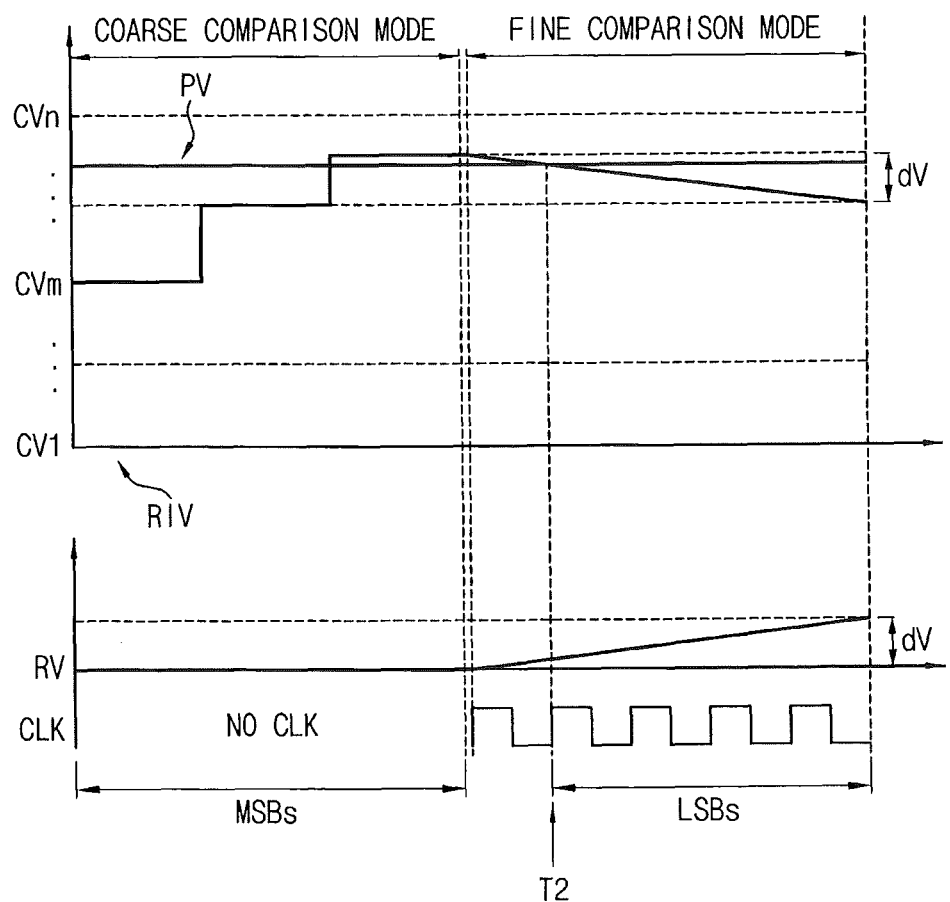
FIG. 21 is a timing diagram illustrating an example of an operation of an analog to digital converter of FIG. 18.

FIG. 21 is a timing diagram illustrating an example of an operation of an analog to digital converter of FIG. 18.

Referring to FIG. 21, the analog to digital converter 700 may operate a dual mode of the coarse comparison mode and the fine comparison mode. The clock signal CLK may not be input in the coarse comparison mode. On the other hand, the clock signal CLK may be input for calculating the least significant bits FDC in the fine comparison mode. The ramp initial voltage RIV may correspond to the first reference voltage CV1. The ramp voltage RV may be maintained as the ramp initial voltage RIV in the coarse comparison mode, and may be increased or decreased at a predetermined slope by an integer times a predetermined voltage dV in the fine comparison mode. The predetermined voltage dV may be a voltage difference among the reference voltages (i.e., the first through (n)th reference voltage). As illustrated in FIG. 21, the reference voltages (i.e., the first through (n)th reference voltage CV1 through CVn) are candidates of the selected reference voltage CV. The reference voltages (i.e., the first through (n)th reference voltage CV1 through CVn) are increased by the predetermined voltage dV as n increases. The ramp voltage RV may be increased with a predetermined slope by the predetermined voltage dV in the fine comparison mode. The first through (n)th reference voltage CV1 through CVn may be selected as the selected reference voltage CV using the binary search tree algorithm.

In the coarse comparison mode, the analog to digital converter 700 may select the selected reference voltage CV among the first through (n)th reference voltage CV1 through CVn using the binary search tree algorithm. Then, the analog to digital converter 700 may determine the selected reference voltage CV as the final reference voltage FCV when the magnitude of the comparison result signal CRS becomes a value within a predetermined range in the coarse comparison mode. For example, when the (m)th reference voltage CVm corresponding to a half value between the first reference voltage CV1 and the (n)th reference voltage CVn may be selected as the selected reference voltage CV, the (m)th reference voltage CVm may be compared with the pixel output voltage PV. If the magnitude of the comparison result signal is not within the predetermined range, the selected reference voltage CV may be changed. Here, since the pixel output voltage is greater than the (m)th reference voltage CVm, a half value between the (m)th reference voltage CVm and the (n)th reference voltage CVn may be selected as the selected reference voltage CV in the next loop. In this manner, the analog to digital converter 700 may determine the final reference voltage FCV by changing the selected reference voltage CV until the magnitude of the comparison result signal CRS comes within the predetermined range.

In the fine comparison mode, as the ramp voltage RV is increased with a predetermined slope, the comparison result signal CRS may be changed. The comparison result signal CRS may be continuously generated based on the final reference voltage FCV, the pixel output voltage PV, the ramp initial voltage RIV, and the ramp voltage RV. As describe above, the comparison result signal CRS may be generated using the [Expression 1]. Here, the comparison result signal CRS may be gradually decreased because the ramp voltage RV is gradually increased at a predetermined slope. The analog to digital converter 700 may generate the LSBs by counting the clock signal CLK from the second timing point T2 to the end timing point of the fine comparison mode. At the second timing point T2, the polarity of the comparison result signal CRS may be changed from a second polarity (e.g., a positive polarity) to a first polarity (e.g., a negative polarity). Then, the analog to digital converter 700 may generate the digital signal DS corresponding to the pixel output voltage PV by summing the MSBs generated by the MSBs generation unit 790 and the LSBs calculated by the digital signal generation unit 780. Since a calculation of the MSBs and the LSBs is an example, the calculation of the MSBs and the LSBs is not limited thereto.

Figure 22:
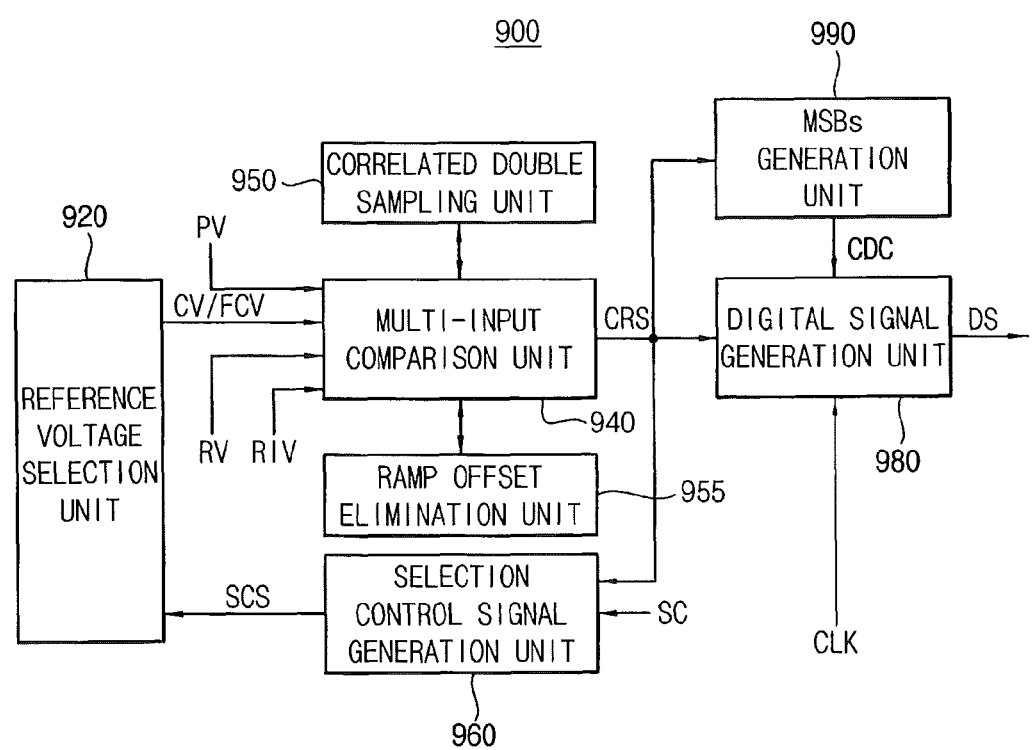
FIG. 22 is a block diagram illustrating an analog to digital converter according to some example embodiments.

FIG. 22 is a block diagram illustrating an analog to digital converter according to some example embodiments.

Referring to FIG. 22, the analog to digital converter 900 may include a reference voltage selection unit 920, a multi-input comparison unit 940, a selection control signal generation unit 960, a digital signal generation unit 980, and a most significant bits (MSBs) generation unit 990. In addition, the analog to digital converter 900 may further include a correlated double sampling unit 950 and/or a ramp offset elimination unit 955. Since the reference voltage selection unit 920, the multi-input comparison unit 940, the selection control signal generation unit 960, the digital signal generation unit 980, and the MSBs generation unit 990 are described in FIG. 18, the description of the reference voltage selection unit 920, the multi-input comparison unit 940, the selection control signal generation unit 960, the digital signal generation unit 980, and the MSBs generation unit 990 will be omitted.

The correlated double sampling unit 950 may perform correlated double sampling operations for the pixel output voltage PV. That is, the analog to digital converter 900 having the correlated double sampling unit 950 may generate a first digital signal by performing ADC operations for a reset voltage, may generate a second digital signal by performing ADC operations for a conversion voltage, and may output the digital signal DS by subtracting the second digital signal from the first digital signal. The ramp offset elimination unit 955 may perform ramp offset elimination operations for the ramp initial voltage RIV and the ramp voltage RV. That is, the ramp offset elimination unit 955 may eliminate an offset voltage between the ramp initial voltage RIV and the ramp voltage RV by coupling an input terminal of the ramp voltage RV to an input terminal of the multi-input comparison unit 940.

Figure 23:
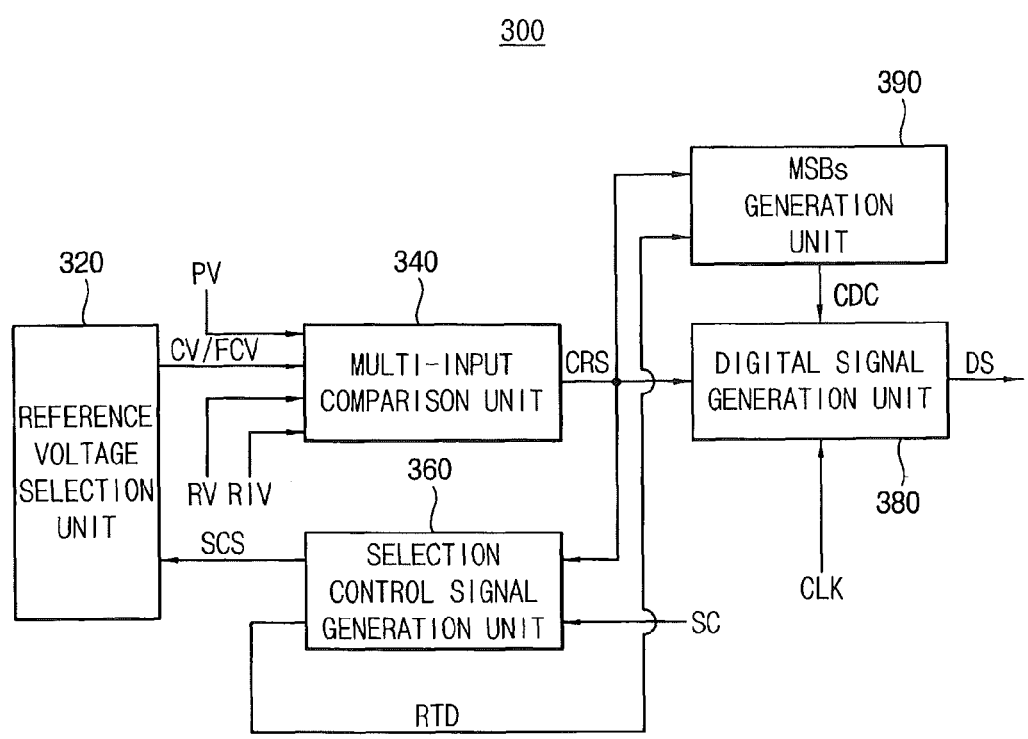
FIG. 23 is a block diagram illustrating an analog to digital converter according to some example embodiments.

FIG. 23 is a block diagram illustrating an analog to digital converter according to some example embodiments.

Referring to FIG. 23, the analog to digital converter 300 may include a reference voltage selection unit 320, a multi-input comparison unit 340, a selection control signal generation unit 360, a digital signal generation unit 380, and a most significant bits (MSBs) generation unit 390.

The reference voltage selection unit 320 may output a selected reference voltage CV by selecting one of a plurality of reference voltages based on a selection control signal SCS. The selection control signal SCS for updating the selected reference voltage CV may be input until a final reference voltage FCV is determined in a coarse comparison mode, and the selection control signal SCS for maintaining the selected reference voltage CV may be input after the final reference voltage FCV is determined in the coarse comparison mode until a fine comparison mode is finished. In one example embodiment, the reference voltages may include a first through (n)th reference voltage. Here, n is an integer greater than 1. The reference voltages (i.e., the first through (n)th reference voltage) may be increased or decreased by a predetermined voltage as n increases. The reference voltage selection unit 320 may sequentially select the reference voltages (i.e., the first through (n)th reference voltage) as the selected reference voltage CV until the final reference voltage FCV is determined in the coarse comparison mode.

The multi-input comparison unit 340 may generate a comparison result signal CRS based on the selected reference voltage CV, the pixel output voltage PV, the ramp initial voltage RIV, and the ramp voltage RV. The multi-input comparison unit 340 may include a plurality input terminals for receiving the selected reference voltage CV, the pixel output voltage PV, the ramp initial voltage RIV, and the ramp voltage RV. When the multi-input comparison unit 340 generates the comparison result signal CRS, the second voltage difference between the ramp voltage RV and the ramp initial voltage RIV may be zero. Thus, the comparison result signal CRS in the coarse comparison mode may substantially depend on the first voltage difference between the selected reference voltage CV and the pixel output voltage PV. On the other hand, when the multi-input comparison unit 340 generates the comparison result signal CRS, the pixel output voltage PV may be fixed, and the selected reference voltage CV may be maintained as the final reference voltage FCV. Thus, the comparison result signal CRS in the fine comparison mode may substantially depend on the second voltage difference between the ramp voltage RV and the ramp initial voltage RIV.

The selection control signal generation unit 360 may generate the selection control signal SCS based on the comparison result signal CRS and a comparison mode signal SC. Here, the selection control signal generation unit 360 may include a storage block (e.g., a register) that stores register data RTD corresponding to polarity change information of the comparison result signal CRS. Thus, when the register data RTD is input from the selection control signal generation unit 360 to the MSBs generation unit 390, most significant bits CDC corresponding to the register data RTD may be determined according to a predetermined mapping table. The coarse comparison mode may correspond to a period in which the comparison mode signal SC has a first logic level, and the fine comparison mode may correspond to a period in which the comparison mode signal SC has a second logic level.

The MSBs generation unit 390 may generate the most significant bits CDC based on the register data RTD input from the selection control signal generation unit 360 in the coarse comparison mode. That is, the analog to digital converter 300 may not generate the most significant bits CDC using a clock signal count method. The MSBs generation unit 390 may set the predetermined mapping table between the most significant bits CDC and the register data RTD. Then, the MSBs generation unit 390 may output the most significant bits CDC corresponding to the register data RTD when the polarity of the comparison result signal CRS is changed. Then, in the fine comparison mode, the digital signal generation unit 380 may generate least significant bits FDC based on the comparison result signal CRS using the clock signal count method, and may output the digital signal DS corresponding to the pixel output voltage PV by summing the most significant bits CDC and the least significant bits FDC.

Figure 24:
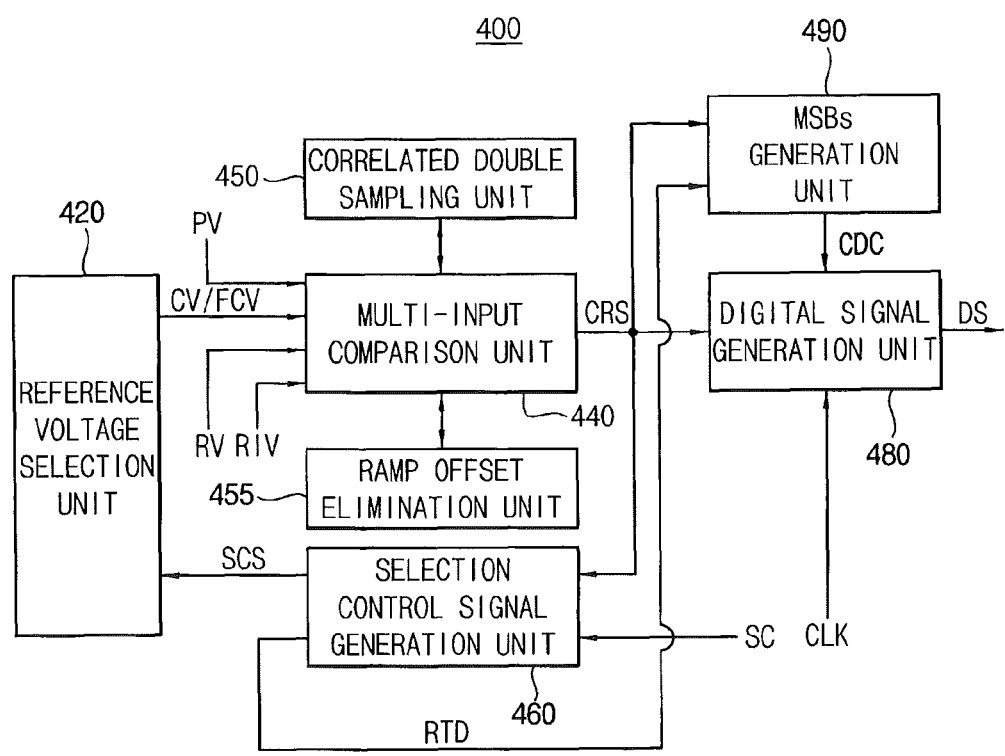
FIG. 24 is a block diagram illustrating an analog to digital converter according to some example embodiments.

FIG. 24 is a block diagram illustrating an analog to digital converter according to some example embodiments.

Referring to FIG. 24, the analog to digital converter 400 may include a reference voltage selection unit 420, a multi-input comparison unit 440, a selection control signal generation unit 460, a digital signal generation unit 480, and a most significant bits (MSBs) generation unit 490. In addition, the analog to digital converter 400 may further include a correlated double sampling unit 450 and/or a ramp offset elimination unit 455. Since the reference voltage selection unit 420, the multi-input comparison unit 440, the selection control signal generation unit 460, the digital signal generation unit 480, and the MSBs generation unit 490 are described in FIG. 23, the description of the reference voltage selection unit 420, the multi-input comparison unit 440, the selection control signal generation unit 460, the digital signal generation unit 480, and the MSBs generation unit 490 will be omitted.

The correlated double sampling unit 450 may perform correlated double sampling operations for the pixel output voltage PV. That is, the analog to digital converter 400 having the correlated double sampling unit 450 may generate a first digital signal by performing ADC operations for a reset voltage, may generate a second digital signal by performing ADC operations for a conversion voltage, and may output the digital signal DS by subtracting the second digital signal from the first digital signal. The ramp offset elimination unit 455 may perform ramp offset elimination operations for the ramp initial voltage RIV and the ramp voltage RV. That is, the ramp offset elimination unit 455 may eliminate an offset voltage between the ramp initial voltage RIV and the ramp voltage RV by coupling an input terminal of the ramp voltage RV to the input terminal of the multi-input comparison unit 440.

Figure 25:
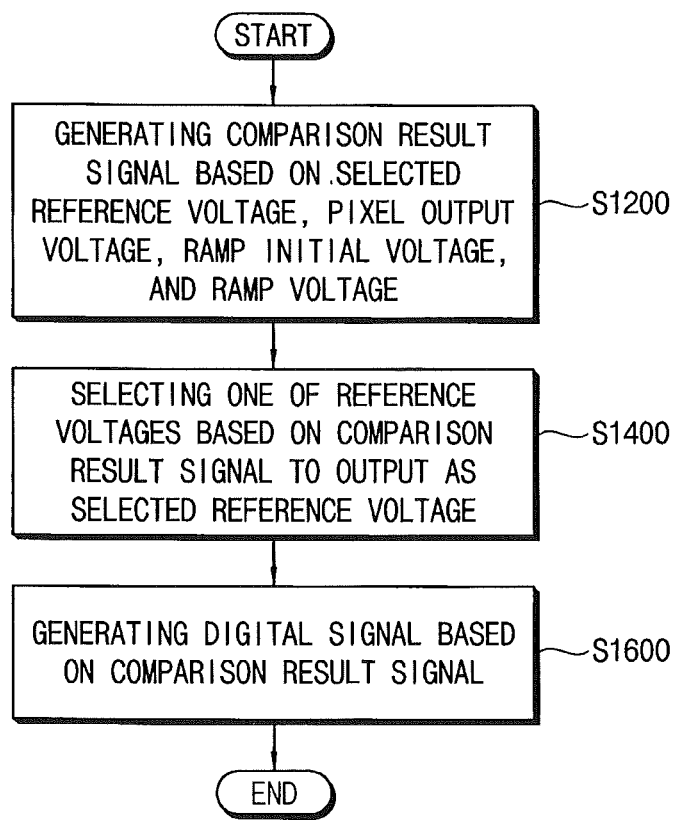
FIG. 25 is a flow chart illustrating a method of converting an analog signal to a digital signal according to some example embodiments.

FIG. 25 is a flow chart illustrating a method of converting an analog signal to a digital signal according to some example embodiments.

Referring to FIG. 25, in the method of converting an analog signal to a digital signal, the comparison result signal may be generated based on the selection reference voltage, the pixel output voltage, the ramp initial voltage, and the ramp voltage (Step S1200). One of the reference voltages (i.e., the first through (n)th reference voltage) may be selected as the selected reference voltage based on the comparison result signal (Step S1400). The digital signal corresponding to the pixel output voltage may be generated based on the comparison result signal (Step S1600). As described above, the method of FIG. 25 may perform a dual mode of the coarse comparison mode and the fine comparison mode based one ramp voltage. Thus, the method of FIG. 25 may prevent (or reduce) offset mismatching and ramp voltage slope mismatching, and may prevent time noises and unnecessary power consumption due to sampling capacitors. As a result, an image sensor employing the method of FIG. 25 may generate a high-quality image.

Figure 26:
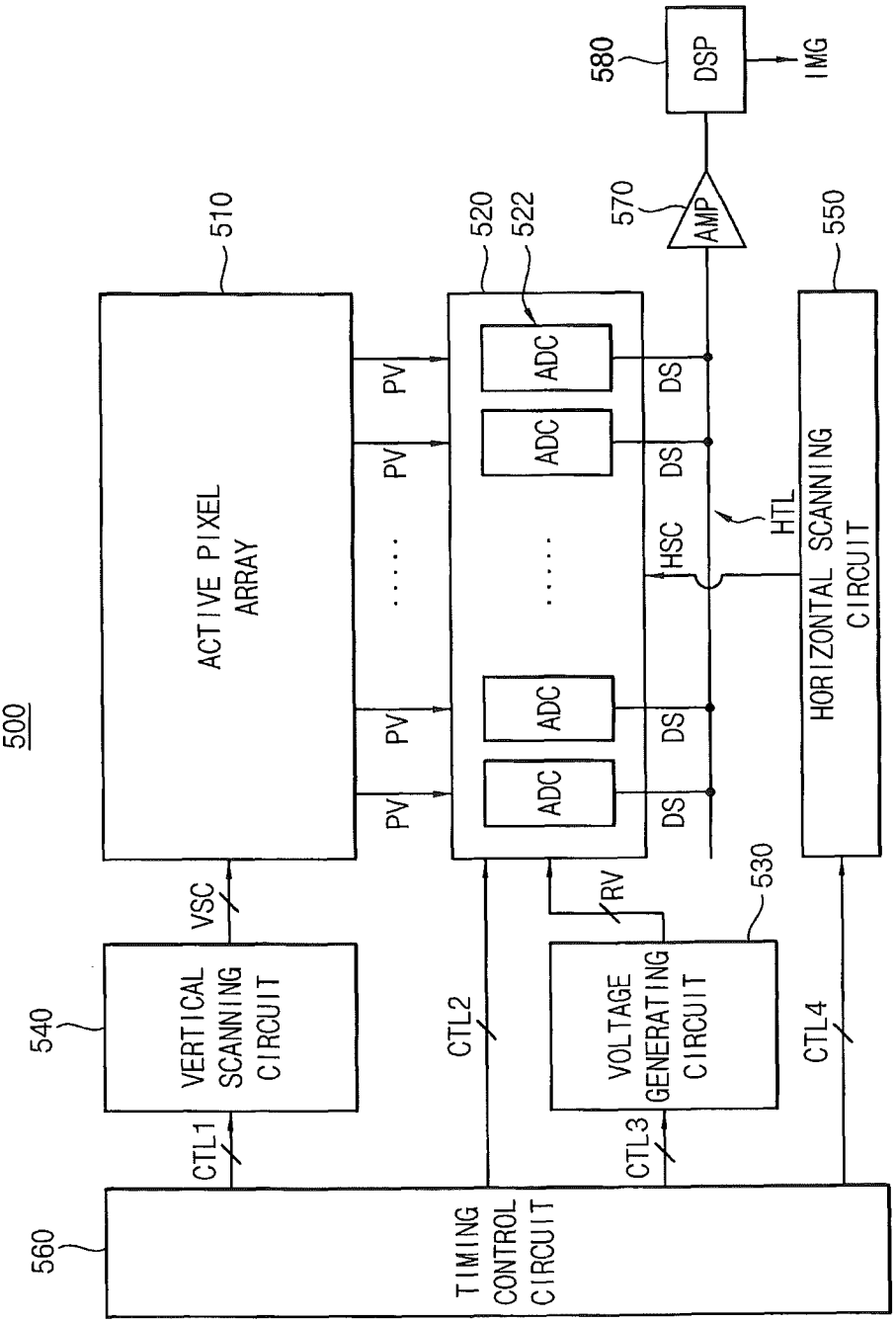
FIG. 26 is a block diagram illustrating an image sensor having analog to digital converters according to some example embodiments.

FIG. 26 is a block diagram illustrating an image sensor having analog to digital converters according to some example embodiments.

Referring to FIG. 26, the image sensor 500 may include an active pixel array 510, an analog to digital converting circuit 520, a voltage generating circuit 530, a vertical scanning circuit 540, a horizontal scanning circuit 550, a timing control circuit 560, an amplifying circuit 570, and a digital signal processing circuit 580. In the image sensor 500, the number of analog to digital converters 522 in the analog to digital converting circuit 520 may be the same as the number of column lines coupled to the active pixel array 510, and the column lines may be coupled to the analog to digital converters 522, respectively. That is, the image sensor 500 may be implemented by a column analog to digital conversion manner.

The active pixel array 510 may include a plurality of unit pixels arranged in matrix manner. Each of the unit pixels may include a photodiode and a signal generating circuit. Each of the unit pixels may have 3-transistor structure, 4-transistor structure, 5-transistor structure, etc according to the number of transistors in the signal generating circuit. Row lines and column lines may be arranged in a cross manner on the active pixel may. For example, when the active pixel array 510 includes m*n unit pixels, n row lines and m column lines may be arranged in a cross manner on the active pixel array 510. In one example embodiment, the image sensor 500 may employ a bayer pattern technique. In this case, the unit pixels in the active pixel array 510 may be arranged to receive a set of red light, green light, and blue light, or a set of magenta light, yellow light, and cyan light. In one example embodiment, the image sensor 500 may employ an auto dark level compensation (ALDC) technique. In this case, at least one optical black pixel array may be arranged near the active pixel array 510.

The analog to digital converting circuit 520 may convert pixel output voltages PV output from the unit pixels in the active pixel array 510 into digital signals DS. The analog to digital converting circuit 520 may include at least one analog to digital converter 522 that generates the digital signal DS based on a selected reference voltage CV, the pixel output voltage PV, a ramp initial voltage RIV, and the ramp voltage RV. In the analog to digital converting circuit 520, the at least one analog to digital converter 522 may be arranged to be coupled to the column lines, respectively. As described above, the at least one analog to digital converter 522 may prevent offset mismatching and ramp voltage slope mismatching because the at least one analog to digital converter 522 uses one ramp voltage RV, and may prevent time noises and unnecessary power consumption because the at least one analog to digital converter 522 is implemented without sampling capacitors.

In one example embodiment, the at least one analog to digital converter 522 may include a reference voltage selection unit, a multi-input comparison unit, a selection control signal generation unit, and a digital signal generation unit. The reference voltage selection unit may select one of a plurality of reference voltages based on a selection control signal to output a selected reference voltage. The multi-input comparison unit may generate a comparison result signal based on the selected reference voltage CV, the pixel output voltage PV, the ramp initial voltage RIV, and the ramp voltage RV. The selection control signal generation unit may generate the selection control signal based on the comparison result signal and a comparison mode signal. The digital signal generation unit may generate the digital signal DS corresponding to the pixel output voltage PV by counting a clock signal based on the comparison result signal. In another example embodiment, the at least one analog to digital converter 522 may include a reference voltage selection unit, a multi-input comparison unit, a selection control signal generation unit, a most significant bits (MSBs) generation unit, and a digital signal generation unit. The reference voltage selection unit may select one of a plurality of reference voltages based on a selection control signal to output a selected reference voltage. The multi-input comparison unit may generate a comparison result signal based on the selected reference voltage CV, the pixel output voltage PV, the ramp initial voltage RIV, and the ramp voltage RV. The selection control signal generation unit may generate the selection control signal based on the comparison result signal and the comparison mode signal. The MSBs generation unit may generate most significant bits based on the comparison result signal using a successive approximation method in the coarse comparison mode. The digital signal generation unit may generate least significant bits based on the comparison result signal using a clock signal count method in the fine comparison mode, and may generate the digital signal DS corresponding to the pixel output voltage PV based on the most significant bits and the least significant bits.

Further, the at least one analog to digital converter 522 may include a correlated double sampling unit and/or a ramp offset elimination unit. The correlated double sampling unit may perform correlated double sampling operations for the pixel output voltage PV. The ramp offset elimination unit may perform ramp offset elimination operations for the ramp initial voltage RIV and the ramp voltage RV. The analog to digital converting circuit 520 may perform analog to digital conversion (ADC) operations based on control signals CTL2 input from the timing control circuit 560. The ADC operations may be performed during every horizontal scan periods.

The voltage generating circuit 530 may generate a plurality of voltages (e.g., the reference voltages, the ramp initial voltage, the ramp voltage, etc) to provide to the at least one analog to digital converter 522 in the analog to digital converting circuit 520. The vertical scanning circuit 540 may receive control signals CTL1 from the timing control circuit 560, and may control row address and row scanning operation for the active pixel array 510. That is, the vertical scanning circuit 540 may provide a signal for activating one of row lines to select the one of row lines. In one example embodiment, the vertical scanning circuit 540 may include a vertical decoder and a vertical driver. The vertical decoder may select one of row lines. The vertical driver may provide the signal for activating the selected row line. The horizontal scanning circuit 550 may receive control signals CTL4 from the timing control circuit 560, and may control column address and column scanning operation for the active pixel array 510. That is, the horizontal scanning circuit 550 may output the digital signals DS input from the analog to digital converting circuit 520 to the digital signal processing circuit 580 via the horizontal transfer line HTL and the amplifying circuit 570. For example, the horizontal scanning circuit 550 may sequentially select the at least one analog to digital converter 522 by outputting a horizontal scanning control signal HSC to the analog to digital converting circuit 520. In one example embodiment, the horizontal scanning circuit 550 may include a horizontal decoder and a horizontal driver. The horizontal decoder may select the at least one analog to digital converter 522 in the analog to digital converting circuit 520. The horizontal driver may drive an output of the selected analog to digital converter 522 to the horizontal transfer line HTL.

The timing control circuit 560 may control the vertical scanning circuit 540, the analog to digital converting circuit 520, the voltage generating circuit 530, and the horizontal scanning circuit 550, etc based on a master clock signal. That is, the timing control circuit 560 may provide control signals CTL1, CTL2, CTL3, and CTL4 (e.g., a clock signal, a timing control signal, etc) for operating the vertical scanning circuit 540, the analog to digital converting circuit 520, the voltage generating circuit 530, and the horizontal scanning circuit 550, etc. In one example embodiment, the timing control circuit 560 may include a logic control circuit, a phase lock loop (PLL) circuit, a communication interface circuit, etc. The amplifying circuit 570 may amplify the digital signals DS to output the amplified digital signals DS to the digital signal processing circuit 580. Although one amplifying circuit 570 is illustrated in FIG. 26, the image sensor 500 may include a plurality of amplifying circuits 570. The digital signal processing circuit 580 may receive the amplified digital signals DS from the amplifying circuit 570, and may generate an image signal IMG based on the amplified digital signals DS. Then, the image signal IMG output from the digital signal processing circuit 580 may be displayed on a display device such as a liquid crystal display (LCD) device.

Figure 27:
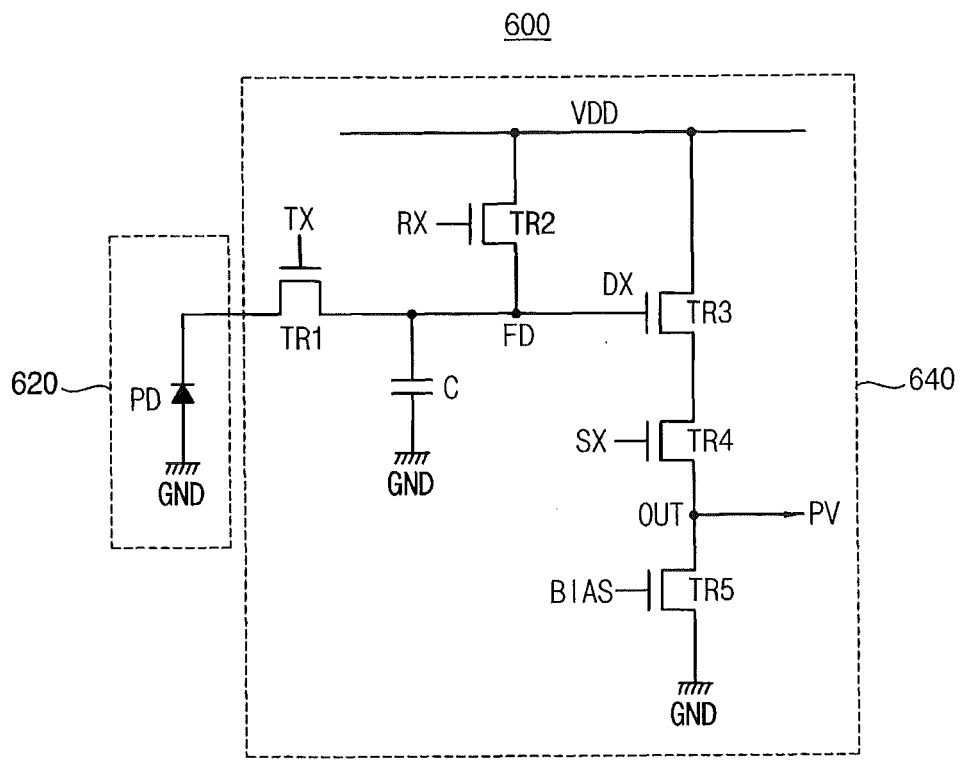
FIG. 27 is a circuit diagram illustrating a unit pixel in an active pixel array of an image sensor of FIG. 26.

FIG. 27 is a circuit diagram illustrating a unit pixel in an active pixel array of an image sensor of FIG. 26.

Referring to FIG. 27, the unit pixel 600 may include a photodiode 620 and a signal generating circuit 640. The unit pixel 600 may have 3-transistor structure, 4-transistor structure, 5-transistor structure, etc according to the number of transistors in the signal generating circuit 640. As illustrated in FIG. 27, the unit pixel 600 has a 5-transistor structure. Thus, the unit pixel 600 may include the photodiode PD, a transfer transistor TR1, a reset transistor TR2, a source follower transistor TR3, a select transistor TR4, and a bias transistor TR5.

The photodiode 620 may receive light from outside, and may perform photoelectric transformations to generate electric charges corresponding to the light. Then, the signal generating circuit 640 may output the pixel output voltage PV based on the electric charges generated by the photodiode 620. The pixel output voltage PV as an analog signal may be converted to the digital signal DS by the at least one analog to digital converter 522. As described above, when the image sensor 500 employs the bayer pattern technique, the unit pixel 600 may generate the pixel output voltage PV (i.e., the analog signal) corresponding to red light, green light, or blue light. Thus, a color filter (i.e., a red filter, a green filter, or a blue filter) may be placed on the unit pixel 600.

The photodiode PD may be placed between the transfer transistor TR1 and a ground voltage GND. The signal generating circuit 640 may include the transfer transistor TR1, the reset transistor TR2, the source follower transistor TR3, the select transistor TR4, and the bias transistor TR5. In addition, a floating diffusion node FD may be formed by a capacitor C. In the transfer transistor TR1, a gate terminal of the transfer transistor TR1 may receive a transfer signal TX, a first terminal of the transfer transistor TR1 may be coupled to the photodiode PD, and a second terminal of the transfer transistor TR1 may be coupled to the floating diffusion node FD. Thus, the transfer transistor TR1 may transfer the electric charges accumulated by the photodiode PD to the floating diffusion node FD. In the reset transistor TR2, a gate terminal of the reset transistor TR2 may receive a reset signal RX, a first terminal of the reset transistor TR2 may be coupled to the floating diffusion node FD, and a second terminal of the reset transistor TR2 may be coupled to a power voltage VDD. In the source follower transistor TR3, a gate terminal of the source follower transistor TR3 may be coupled to the floating diffusion node FD, a first terminal of the source follower transistor TR3 may be coupled to a second terminal of the select transistor TR4, and a second terminal of the source follower transistor TR3 may be coupled to the power voltage VDD. In the select transistor TR4, a gate terminal of the select transistor TR4 may receive a row selection signal SX, a first terminal of the select transistor TR4 may be coupled to an output terminal OUT, and the second terminal of the select transistor TR4 may be coupled to the first terminal of the source follower transistor TR3. In the bias transistor TR5, a gate terminal of the bias transistor TR5 may receive a bias voltage BIAS, a first terminal of the bias transistor TR5 may be coupled to the output terminal OUT, and a second terminal of the bias transistor TR5 may be coupled to the ground voltage GND. The photodiode 220 may perform photoelectric transformations, and may be placed between the transfer transistor 245 and the ground voltage GND. As described above, the photodiode 220 may include a plurality of doping regions that are laminated in the slope direction based on the slope angle of the light.

The photodiode PD may transform the light to the electric charges. The transfer transistor TR1 may be turned on when the transfer signal TX is input to the gate terminal of the transfer transistor TR1. Thus, the electric charges accumulated by the photodiode PD may be transferred to the floating diffusion node FD when the transfer signal TX is input to the gate terminal of the transfer transistor TR1. Here, the reset transistor TR2 is maintained in a turn-off state so that electric potential of the floating diffusion node FD may be changed by the electric charges. As the electric potential of the floating diffusion node FD is changed, the electric potential of the gate terminal of the source follower transistor TR3 may be changed. Then, a bias of the first terminal of the source follower transistor TR3 (i.e., a bias of the second terminal of the select transistor TR4) may be changed. When the row selection signal SX is input to the gate terminal of the select transistor TR4, the pixel output voltage PV corresponding to the accumulated electric charges may be output through the output terminal OUT. After the pixel output voltage PV corresponding to the electric charges generated by the photodiode PD is detected, the reset signal RX may be input to the gate terminal of the reset transistor TR2. Then, the reset transistor TR2 is turned on based on the reset signal RX so that a sensing process may be initialized. That is, the electric charges in the floating diffusion node FD may be discharged to a power source (i.e. the power voltage VDD). As a result, the electric potential of the floating diffusion node FD may be substantially the same as the power voltage VDD.

As described above, the at least one analog to digital converter 522 may further include a correlated double sampling unit that performs correlated double sampling operations for the pixel output voltage PV. The unit pixel 600 may output the pixel output voltage PV (i.e., the reset voltage and the conversion voltage) for the correlated double sampling operations. In detail, the at least one analog to digital converter 522 may turn on the transfer transistor TR1 and the reset transistor TR2, and may turn off the select transistor TR4. Thus, light sensing operations may be ready because the photodiode PD is fully depleted. Then, the at least one analog to digital converter 522 may perform the photoelectric transformations by turning off the transfer transistor TR1. At this time, if the at least one analog to digital converter 522 turns off the reset transistor TR2 and the select transistor TR4, the reset voltage may be output as the pixel output voltage PV because the power voltage VDD is applied to the floating diffusion node FD. Subsequently, if the at least one analog to digital converter 522 turns on the transfer transistor TR1, the conversion voltage may be output as the pixel output voltage PV because the electric charges generated by the photodiode PD are applied into the floating diffusion node FD. Thus, the at least one analog to digital converter 522 may perform the correlated double sampling operations by performing the ADC operations for the reset voltage and the conversion voltage.

Figure 28:
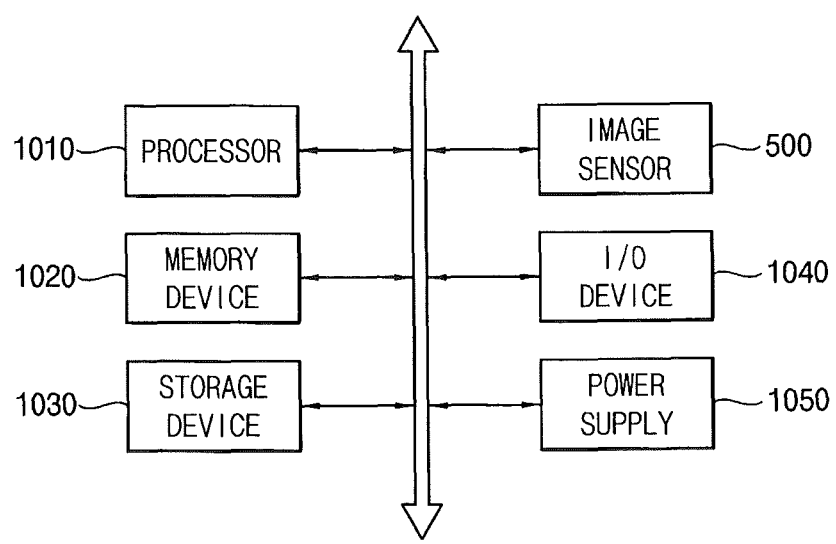
FIG. 28 is a block diagram illustrating an example of an electric device having an image sensor of FIG. 27.

FIG. 28 is a block diagram illustrating an example of an electric device having an image sensor of FIG. 27.

Referring to FIG. 28, the electric device 1000 may include a processor 1010, a memory device 1020, a storage device 1030, an input/output (I/O) device 1040, a power supply 1050, and an image sensor 500. As not illustrated in FIG. 28, the electric device 100 may further include a plurality of ports for communicating a video card, a sound card, a memory card, a universal serial bus (USB) device, other electric devices, etc.

The processor 1010 may perform various computing functions. The processor 1010 may be a micro processor, a central processing unit (CPU), and etc. The processor 1010 may be coupled to the memory device 1020 via a bus such as an address bus, a control bus, a data bus, etc. Further, the processor 1010 may be coupled to an extended bus such as a peripheral component interconnection (PCI) bus. The memory device 1020 may store data for operations of the electric device 1000. For example, the memory device 1020 may be a dynamic random access memory (DRAM) device, a static random access memory (SRAM) device, an erasable programmable read-only memory (EPROM) device, an electrically erasable programming read-only memory (EEPROM) device, a flash memory device, etc. The storage device 1030 may be a solid state drive device, a hard disk drive device, a CD-ROM device, etc. The I/O device 1040 may be an input device such as a keyboard, a keypad, a mouse, etc, and an output device such as a printer, a display device, etc. The power supply 1050 may provide a power for operations of the electric device 1000.

The image sensor 500 may communicate with the processor 1010 via buses or other communication links. As described above, the image sensor 500 may include the at least one analog to digital converter 522 in the analog to digital converting circuit 520. The at least one analog to digital converter 522 may prevent offset mismatching and slope mismatching among a plurality of ramp voltages because the at least one analog to digital converters 522 use one ramp voltage, and may prevent time noises and unnecessary power consumption because the at least one analog to digital converter 522 do not include sampling capacitors. Thus, the image sensor 500 may generate high quality images. In one example embodiment, the at least one analog to digital converter 522 may include the reference voltage selection unit, the multi-input comparison unit, the selection control signal generation unit, and the digital signal generation unit. In another example embodiment, the at least one analog to digital converter 522 may include the reference voltage selection unit, the multi-input comparison unit, the selection control signal generation unit, the MSBs generation unit, and the digital signal generation unit. In addition, the at least one analog to digital converter 522 may further include the correlated double sampling unit and/or the ramp offset elimination unit. The image sensor 500 may be integrated with the processor 1010 in one chip. Here, the electric device 1000 may be a computer, a digital camera, a cellular phone, a personal digital assistant (PDA), a scanner, a navigation system, a video phone, an auto-focusing system, etc.

FIG. 29 is a block diagram illustrating an example of an interface used for an electric device of FIG. 28.

Referring to FIG. 29, the electric device 1000 may be implemented by a data processing device that uses, or supports a mobile industry processor interface (MIPI) interface (e.g., a mobile phone, a personal digital assistant (PDA), a portable multimedia player (PMP), a smart phone, etc). The electric device 100 may include an application processor 1010, an image sensor 1140, a display device 1150, etc. A CSI host 1112 of the application processor 1110 may perform a serial communication with a CSI device 1141 of the image sensor 1140 using a camera serial interface (CSI). In one example embodiment, the CSI host 1112 may include a light deserializer (DES), and the CSI device 1141 may include a light serializer (SER). A DSI host 1111 of the application processor 1110 may perform in a serial communication with a DSI device 1151 of the display device 1150 using a display serial interface (DSI). In one example embodiment, the DSI host 1111 may include a light serializer (SER), and the DSI device 1151 may include a light deserializer (DES). The electric device 1000 may further include a radio frequency (RF) chip 1160. The RF chip 1160 may perform a communication with the application processor 1110. A physical layer (PHY) 1113 of the electric device 1000 and a physical layer (PHY) 1161 of the RF chip 1160 may perform data communications based on a MIPI DigRF. The application processor 1110 may further include a DigRF MASTER 1114 that controls the data communications of the PHY 1161. The electric device 1000 may include a global positioning system (GPS) 1120, a storage 1170, a MIC 1180, a DRAM device 1185, and a speaker 1190. In addition, the electric device 1000 may perform communications using a ultra wideband (UWB) 1120, a wireless local area network (WLAN) 1220, a worldwide interoperability for microwave access (WIMAX) 1130, etc. However, the structure and the interface of the electric device 1000 are not limited thereto.

The present inventive concept may be applied to an image sensor, and an electric device having the image sensor. For example, the present inventive concept may be applied to an electric device such as a desktop computer, a laptop computer, a digital camera, a video camcorder, a cellular phone, a smart phone, a personal digital assistant (PDA), a scanner, a video phone, a digital television, a navigation device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed:

1. An analog to digital converter (ADC) comprising:
a multi-input comparison unit configured to compare a pixel voltage from an image sensor, a comparison voltage comprising a stepped voltage modified during a coarse mode of operation of the ADC, and a ramp voltage comprising a ramped voltage modified during a fine mode of operation of the ADC, to provide a comparison result signal to indicate whether the comparison voltage combined with the ramp voltage is greater than or less than the pixel voltage;
a selection control signal generation unit receiving the comparison result signal and a mode control signal, indicating that the ADC is operating in coarse mode or fine mode, to provide a selection control signal to allow modification of the comparison voltage in the coarse mode and to hold the comparison voltage constant in the fine mode;
a reference voltage selection unit receiving the selection control signal to control modification of the comparison voltage by repetitively selecting one of a plurality of reference voltages based on the selection control signal; and wherein the multi-input comparison unit is further configured to compare the pixel voltage to the comparison voltage to provide a first voltage difference and is configured to compare the ramp voltage to a ramp initial voltage to provide a second voltage difference and is configured to amplify a difference between the first voltage difference and the second voltage difference during the coarse mode.

2. The ADC of claim 1 further comprising:
a digital signal generation unit including:
  a counter circuit receiving the comparison result signal configured to determine a number of bits representing the pixel value during the coarse mode and during the fine mode;
  a most significant bits (MSB) storage circuit configured to store a number of MSBs representing a first portion of the pixel value determined during the coarse mode;
  a least significant bits (LSB) storage circuit configured to store a number of LSBs representing a second portion of the pixel value determined during the fine mode; and
  a combiner circuit configured to combine the MSBs and the LSBs to provide a digital signal representing the pixel value.

3. The ADC of claim 2 further comprising:
a correlated double sampling unit coupled to the multi-input comparison unit and configured to subtract a reset voltage conversion value from a data signal conversion value to determine a value subtracted from subsequent digital signals generated by the ADC.

4. The ADC of claim 1 further comprising:
a digital signal generation unit including:
  a counter circuit receiving the comparison result signal to determine a number of bits representing the pixel value;
  a most significant bits (MSBs) storage circuit configured to store a number of MSBs representing a first portion the pixel value determined during the coarse mode;
  a least significant bits (LSBs) storage circuit configured to store a number of LSBs representing a second portion of the pixel value determined during the fine mode;
  a combiner configured to combine the MSBs and the LSBs to provide a digital signal representing the pixel value.

5. The ADC of claim 1 further comprising:
a digital signal generation unit including:
  a counter circuit operating only in the fine mode by receiving the comparison result signal to determine a number of bits representing the pixel value;
  a most significant bits (MSBs) storage circuit configured to store a number of MSBs representing a first portion of the pixel value;
  a least significant bits (LSBs) storage circuit configured to store a number of LSBs representing a second portion of the pixel value determined by the counter circuit;
  a combiner configured to combine the MSBs and the LSBs to provide a digital signal representing the pixel value; and the ADC further comprising:
an MSB generation unit configured to receive the comparison result signal to generate the MSBs using successive approximation to approximate the comparison voltage responsive to the comparison result signal, wherein the MSBs are provided to the digital signal generation unit for storage in the most significant bits (MSB) storage circuit.

6. The ADC of claim 5 wherein the MSB generation unit is configured to determine the MSBs in the coarse mode.

7. The ADC of claim 5 further comprising:
a correlated double sampling unit coupled to the multi-input comparison unit and configured to subtract a reset voltage conversion value from a data signal conversion value to determine a value subtracted from subsequent digital signals generated by the ADC.

8. The ADC of claim 1 further comprising:
a digital signal generation unit including:
  a counter circuit receiving the comparison result signal to determine a number of bits representing the pixel value during the fine mode;
  a most significant bits (MSB) storage circuit configured to store a number of MSBs representing a first portion of the pixel value determined during the coarse mode;
  a least significant bits (LSBs) storage circuit configured to store a number of LSBs representing a second portion of the pixel value determined during the fine mode;
  a combiner configured to combine the MSBs and the LSBs to provide a digital signal representing the pixel value.

9. The ADC of claim 1, wherein the selection control Signal generation unit is configured to store a value indicating the comparison voltage generated during the coarse mode used as a final comparison voltage, the ADC further comprising:
a digital signal generation unit including:
  a counter circuit receiving the comparison result signal to determine a number of bits representing the pixel value during the fine mode;
  a most significant bits (MSBs) storage circuit configured to store a number of MSBs representing a first portion of the pixel value;
  a least significant bits (LSBs) storage circuit configured to store a number of LSBs representing a second portion of the pixel value determined during the fine mode;
  a combiner configured to combine the MSBs and the LSBs to provide a digital signal representing the pixel value; and
an MSB generation unit configured to apply the value to a look-up table to map the value to the MSBs, wherein the MSBs are provided to the digital signal generation unit for storage in the most significant bits (MSB) storage circuit.

10. The ADC of claim 9 wherein the MSB generation unit is configured to determine the MSBs in the fine mode.

11. The ADC of claim 9 further comprising:
a correlated double sampling unit coupled to the multi-input comparison unit and configured to subtract a reset voltage conversion value from a data signal conversion value to determine a value subtracted from subsequent digital signals generated by the ADC.

12. The ADC of claim 1 wherein the reference voltage selection unit further comprises:
a shift register circuit configured to load an initial shift register value corresponding to an initial comparison voltage and configured to shift the initial shift register value left responsive to the selection control signal to provide a sequence of switch control signals corresponding to respective stepped comparison voltages; and comparison voltage switches each configured to operate responsive to the switch control signals to selectively provide a respective one of the stepped comparison voltages as the comparison voltage.

13. A method of operating an ADC circuit comprising:
comparing a pixel voltage from an image sensor, a comparison voltage comprising a stepped voltage modified during a coarse mode of operation of the ADC, and a ramp voltage comprising a ramped voltage modified during a fine mode of operation of the ADC, to provide a comparison result signal to indicate whether the comparison voltage combined with the ramp voltage is greater than or less than the pixel voltage;
generating a selection control signal upon receiving the comparison result signal and a mode control signal, indicating that the ADC is operating in coarse mode or fine mode, to allow modification of the comparison voltage in the coarse mode and to hold the comparison voltage constant in the fine mode;
modifying the comparison voltage by repetitively selecting one of a plurality of reference voltages based on the selection control signal;
comparing the pixel voltage to the comparison voltage to provide a first voltage difference and comparing the ramp voltage to a ramp initial voltage to provide a second voltage difference; and
amplifying a difference between the first voltage difference and the second voltage difference during the coarse mode.

14. The method according to claim 13 wherein generating further comprises:
updating the selection control signal to modify the comparison voltage if the comparison result signal does not change polarity;
updating the selection control signal to hold the comparison voltage as a final comparison voltage if the comparison result signal changes polarity; and
determining most significant bits (MSBs) as a first portion of the pixel value based on the final comparison voltage.

15. The method according to claim 14 further comprising:
modifying the ramp voltage, in the fine mode, according to a predetermined slope until the comparison result signal changes polarity at a first time to provide;
determining least significant bits (LSBs) as a second portion of the pixel; and
combining the MSBs and the LSBs to provide the digital signal.

16. The method according to claim 14 further comprising:
performing a correlated double sampling operation by subtracting a reset voltage conversion value from a data signal conversion value to determine a value subtracted from subsequent digital signals generated by the ADC.

17. A system comprising:
an application processor circuit configured to process data corresponding images;
an image sensor device, coupled to the application processor circuit Via an interface, configured to provide the data corresponding to the images, the image sensor device comprising:
an active pixel array including a plurality of pixels each providing a respective pixel value representing the images responsive to a vertical scanning circuit;
a bank of analog to digital converter (ADC) circuits coupled to the active pixel array, each comprising:
a multi-input comparison unit configured to compare a respective pixel voltage, a comparison voltage comprising a stepped voltage modified during a coarse mode of operation of the ADC, and a ramp voltage comprising a ramped voltage modified during a fine mode of operation of the ADC, to provide a comparison result signal to indicate whether the comparison voltage combined with the ramp voltage is greater than or less than the respective pixel voltage, wherein the multi-input comparison unit is further configured to compare the pixel voltage to the comparison voltage to provide a first voltage difference and is configured to compare the ramp voltage to a ramp initial voltage to provide a second voltage difference and is configured to amplify a difference between the first voltage difference and the second voltage difference during the coarse mode;
a selection control signal generation unit receiving the comparison result signal and a mode control signal, indicating that the ADC is operating in coarse mode or fine mode, to provide a selection control signal to allow modification of the comparison voltage in the coarse mode and to hold the comparison voltage constant in the fine mode;
a reference voltage selection unit receiving the selection control signal to control modification of the comparison voltage by repetitively selecting one of a plurality of reference voltages based on the selection control signal; and
a digital signal generation unit configured to combine least significant bits (LSBs) and most significant bits (MSBs) to provide a respective digital signal representing the respective pixel value.

18. The System according to claim 17 wherein the interface comprises a camera serial interface.

* * * * *